(12) United States Patent
Park et al.

(10) Patent No.: US 11,805,609 B2
(45) Date of Patent: Oct. 31, 2023

(54) DISPLAY MODULE AND DISPLAY DEVICE

(71) Applicant: LG Display Co., Ltd., Seoul (KR)

(72) Inventors: Chanhyeok Park, Paju-si (KR); Chikyung Sung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 17/538,682

(22) Filed: Nov. 30, 2021

(65) Prior Publication Data

US 2022/0210933 A1 Jun. 30, 2022

(30) Foreign Application Priority Data

Dec. 24, 2020 (KR) .................. 10-2020-0183759

(51) Int. Cl.
*H05K 5/02* (2006.01)
*H05K 5/03* (2006.01)

(52) U.S. Cl.
CPC ............. *H05K 5/0217* (2013.01); *H05K 5/03* (2013.01)

(58) Field of Classification Search
CPC ....... G06F 1/1637; H05K 5/0217; H05K 5/03
See application file for complete search history.

(56) References Cited

U.S. PATENT DOCUMENTS

| | | | |
|---|---|---|---|
| 9,541,961 B1 * | 1/2017 | Buxton | H04B 15/04 |
| 10,462,896 B1 | 10/2019 | Kwon et al. | |
| 10,915,151 B2 | 2/2021 | Silvanto et al. | |
| 11,087,110 B2 | 8/2021 | Park et al. | |
| 2006/0152905 A1 * | 7/2006 | Kim | H05K 7/20963 361/715 |
| 2011/0261517 A1 | 10/2011 | Fuke | |
| 2013/0027892 A1 * | 1/2013 | Lim | H04M 1/185 361/679.01 |
| 2014/0078719 A1 * | 3/2014 | Jung | H05K 5/02 361/679.01 |
| 2014/0240911 A1 | 8/2014 | Cole et al. | |
| 2015/0003011 A1 * | 1/2015 | Peters | G06F 1/1613 361/679.55 |
| 2015/0192951 A1 * | 7/2015 | Chong | G02F 1/133305 359/894 |
| 2019/0174658 A1 | 6/2019 | Qi et al. | |
| 2019/0278411 A1 * | 9/2019 | Jeon | G09F 9/301 |
| 2020/0057472 A1 * | 2/2020 | Kang | H04M 1/185 |
| 2020/0154605 A1 * | 5/2020 | Bozorgi | G06F 1/203 |
| 2020/0169623 A1 | 5/2020 | Shin | |

(Continued)

FOREIGN PATENT DOCUMENTS

| | | |
|---|---|---|
| KR | 10-2006-0055107 A | 5/2006 |
| KR | 10-1614139 B1 | 2/2016 |

(Continued)

*Primary Examiner* — Sagar Shrestha
(74) *Attorney, Agent, or Firm* — Seed IP Law Group LLP

(57) ABSTRACT

A display module and display device that may suppress a greenish defect and reduce a bezel area while improving a heat-dissipation performance and a shock absorption function include an integral cushion plate including at least one protrusion protruding from and extending along an edge portion of a body with the cushion plate placed on a lower surface of a display panel, and the protrusion brought into contact with a cover member. Further, the protrusion of the cushion plate is bent to have an inclined part so that the protrusion does not contact the side surface of the display panel and contacts the cover member.

19 Claims, 24 Drawing Sheets

(56) References Cited

U.S. PATENT DOCUMENTS

| | | | |
|---|---|---|---|
| 2020/0194516 A1 | 6/2020 | Kim et al. | |
| 2020/0227504 A1* | 7/2020 | Luo | H10K 50/841 |
| 2020/0249723 A1* | 8/2020 | Mizoguchi | G06F 1/1626 |
| 2020/0325952 A1 | 10/2020 | Ryu et al. | |
| 2020/0393872 A1 | 12/2020 | Lim et al. | |
| 2021/0097253 A1* | 4/2021 | Kim | H05K 5/0017 |
| 2021/0168231 A1 | 6/2021 | Baker et al. | |
| 2021/0291497 A1* | 9/2021 | Shin | B32B 5/18 |
| 2021/0319724 A1* | 10/2021 | Jang | G06F 1/1641 |
| 2021/0336161 A1* | 10/2021 | Xiang | H10K 77/111 |
| 2021/0342567 A1 | 11/2021 | Park et al. | |
| 2021/0356996 A1* | 11/2021 | Zhu | G06F 3/0412 |
| 2021/0378155 A1* | 12/2021 | Qin | H05K 7/20963 |
| 2022/0019114 A1 | 1/2022 | Friedman et al. | |
| 2022/0154467 A1 | 5/2022 | Mort et al. | |
| 2022/0201879 A1* | 6/2022 | Kwak | H05K 5/0217 |

FOREIGN PATENT DOCUMENTS

| | | |
|---|---|---|
| KR | 10-2018-0079044 A | 7/2018 |
| KR | 10-2113483 B1 | 11/2018 |
| KR | 10-2019-0011865 A | 2/2019 |
| KR | 10-2019-0105682 A | 9/2019 |
| KR | 10-2020-0002456 A | 1/2020 |
| KR | 10-2020-0129646 A | 11/2020 |

\* cited by examiner

DISPLAY MODULE AND DISPLAY DEVICE

CROSS-REFERENCE TO RELATED APPLICATION

This application claims a benefit under 35 U.S.C. § 119(a) of Korean Patent Application No. 10-2020-0183759 filed on Dec. 24, 2020, on the Korean Intellectual Property Office, the entirety of disclosure of which is incorporated herein by reference for all purposes.

BACKGROUND

Technical Field

The present disclosure relates to a display module and a display device, and more specifically, a display module and a display device capable of suppressing greenish defect, and improving heat-dissipation performance and shock absorption function while reducing a bezel area.

Description of the Related Art

A display device is implemented in a wide variety of forms as in televisions, monitors, smart phones, tablet PCs, notebook computers, and wearable modules.

In general, the display device includes a display area displaying a screen and a non-display area along an outer periphery of the display area.

The display device includes various additional parts such as a driving integrated circuit or a circuit board in addition to a display panel to display the screen.

In the non-display area, the additional parts may be disposed, or various connection parts such as a flexible circuit board for connecting the additional parts to each other may be disposed.

In the display device, the non-display area is also referred to a bezel area. When the bezel area is wide, a user's gaze may be distracted. However, when the bezel area is narrower, the user's gaze may focus on the screen of the display area such that user immersion increases.

In other words, when the bezel area becomes narrower, an entire size of the display device may be reduced while increasing the user immersion. Accordingly, demand from the user for the display device that may reduce the bezel area as much as possible is increasing.

BRIEF SUMMARY

In the display device, not only a pad of the display panel but also various additional parts such as the driving integrated circuit and the circuit board may be disposed on a lower surface of the display panel in order to secure the display area as large as possible and to ensure the minimum bezel area.

In this case, the various additional components may be mounted on or connected to a connection component such as a flexible circuit board and may be disposed on the lower surface of the display panel.

For example, the flexible circuit board connected to one distal end of the display panel may be bent in a direction from the bezel area to the lower surface of the display panel.

Alternatively, as one distal end of the display panel is bent toward the lower surface of the display panel, the various additional parts may be disposed on the lower surface of the display panel.

In this case, when a bending radius of curvature increases, the flexible circuit board or display panel may be bent more stably and easily. However, as the bending radius of curvature increases, the bezel area increases, and a total width of the display device increases.

A cushion plate for heat-dissipation and shock absorption may be disposed on the lower surface of the display panel.

In one example, the cushion plate has a laminated structure in which a plurality of layers having various functions such as a heat-dissipation layer having a heat-dissipation function, a cushion layer capable of absorbing shock, an adhesive layer for bonding the heat-dissipation layer and the cushion layer to each other, etc., are laminated one on upper of another.

In this case, when a thickness of each of the heat-dissipation layer and the cushion layer is increased, the heat-dissipation function and shock absorption function may increase. However, as the thickness thereof increases, a total thickness of the display device increases, resulting in an increase in the bezel area.

Otherwise, when the thickness of each of the heat-dissipation layer and the cushion layer is thin to reduce the total thickness of the display device, the heat-dissipation function and the shock absorbing function may be deteriorated.

Further, the heat-dissipation layer and cushion layer having different functions may be made of different materials suitable for the functions thereof. In this connection, interlayer separation or adhesion deterioration between the various layers made of different materials may occur.

In particular, in order to fix each layer, a separate adhesive layer must be added between the layers. This may lead to an increase in a thickness, and a limitation in selection of a type of the adhesive layer depending on a material to be bonded and an increase in a cost of the module.

Further, because the cushion plate is formed in a multi-layered structure, change in a shape of the cushion plate may be limited.

When static electricity is generated in the display device, the display device may be damaged due to the static electricity.

For example, when an external charge flows into the cover member of the display device, and the charge is not discharged out of the display module, the charge flows into the display panel, thereby causing greenish defect in which a greenish spot occurs on a screen of the display panel.

Accordingly, it is desirable to reduce the greenish defect by discharging the electric charges flowing into the cover member out of the display module so that the electric charges do not flow into the display panel.

Accordingly, the inventors of the present disclosure have invented a display module and a display device capable of suppressing the greenish defect and improving the heat-dissipation performance and the shock absorption function while reducing the bezel area.

A purpose to be achieved according to an embodiment of the present disclosure is to provide a display module and a display device capable of discharging charges flowing into the cover member out of the display module, thereby suppressing the greenish defect.

A purpose to be achieved according to an embodiment of the present disclosure is to provide a display module and a display device capable of reducing inflow of electric charges into the display panel in a process of discharging the charges through a charge discharge path.

A purpose to be achieved according to an embodiment of the present disclosure is to provide a display module and a display device that may simplify a process for discharging the charge flowing into the cover member out of the display module, and may reduce defect occurrence in the charge discharge path.

A purpose to be achieved according to an embodiment of the present disclosure is to provide a display module and a display device capable of improving a heat-dissipation performance and a shock absorption function while reducing the bezel area.

A purpose to be achieved according to an embodiment of the present disclosure is to provide a display module and a display device capable of improving an electromagnetic interference (EMI) shielding function while reducing the bezel area.

A purpose to be achieved according to an embodiment of the present disclosure is to provide a display module and a display device capable of minimizing interlayer separation or adhesion deterioration between layers constituting a cushion plate.

A purpose to be achieved according to an embodiment of the present disclosure is to provide a display module and a display device including a cushion plate have a higher freedom in a shape change thereof.

Purposes to be achieved according to an embodiment of the present disclosure are not limited to the purpose as mentioned above. Other purposes that are not mentioned may be clearly understood by those skilled in the art based on following descriptions.

A display module according to an embodiment of the present disclosure includes a cover member, a display panel disposed on a lower surface of the cover member, and a cushion plate disposed on a lower surface of the display panel, wherein the cushion plate includes a metal foam.

In this case, the cushion plate includes a body and at least one protrusion protruding from and extending along at least one edge portion of the body, wherein the protrusion contacts the cover member.

The protrusion contacts an edge area of a lower surface of the cover member, but does not contact a side surface of the display panel.

Further, the protrusion is bent from the body in a direction toward the lower surface of the cover member, and has an inclined part.

A module fixing member (or a first connection member) is disposed between the cover member and the display panel. Both of the module fixing member and the protrusion are in contact with the lower surface of the cover member, while the protrusion is spaced, by a predetermined distance, from the module fixing member.

The body and the protrusion of the cushion plate are integral with each other.

The display panel includes a front portion, a bent portion, and a pad portion extending from the bent portion and disposed under a lower surface of the front portion, wherein the protrusion is not disposed on an edge portion of the cushion plate adjacent to the bent portion.

The cushion plate includes an embossed layer and the metal foam disposed on a lower surface of the embossed layer, wherein the metal foam has a porous metal structure having a plurality of pores therein.

A display device according to an embodiment of the present disclosure includes a cover member, the display module according to an embodiment of the present disclosure coupled to a lower surface of the cover member, and a frame disposed on a lower surface of the display module to support the cover member.

According to the present disclosure, the integral cushion plate including at least one protrusion protruding from and extending along an edge portion of the body is placed on the lower surface of the display panel, and the protrusion is brought into contact with the cover member, such that the greenish defect may be suppressed by discharging the electric charge flowing into the cover member out of the display panel through the cushion plate.

Further, according to the present disclosure, the protrusion of the cushion plate may be bent to have an inclined part so that the protrusion does not contact the side surface of the display panel and may contact the cover member, thereby reducing the inflow of the charge into the display panel while the charge is discharged through the charge discharge path.

Further, according to the present disclosure, the cushion plate itself may act as the charge discharge path without addition of a separate process or component, such that the process for discharging the charge may be simplified and a material cost may be reduced, and a defect in the charge discharge path may be reduced.

Further, the cushion plate according to the present disclosure includes the metal foam having both a heat-dissipation function and a cushion function. Thus, the cushion plate may have an effective heat-dissipation function and an effective cushion function at the same time only using the metal foam without a separate heat-dissipation layer or a separate cushion layer.

In particular, the metal foam has a very good heat-dissipation function and a very good cushioning function even when the metal foam is thin. Thus, a total thickness of the cushion plate may be greatly reduced, such that the bezel area may be reduced.

Further, in accordance with of various embodiments of the present disclosure, a thermal conductivity of the metal foam and the EMI shielding performance may be improved while reducing the bezel area.

Further, the cushion plate according to the present disclosure may realize both the heat-dissipation function and the cushion function only using the metal foam. Thus, it is not necessary to stack separate layers made of different materials having a heat-dissipation function and a cushion function, respectively, thereby minimizing the interlayer separation or adhesion deterioration.

In addition, because there is no need to add a separate adhesive layer for fixing each of layers, an increase in thickness due to the adhesive layer or an increase in a manufacturing cost of the module due to the addition of various layers may not occur.

Further, because the cushion plate according to the present disclosure includes the metal foam having a higher freedom in the change shape, the shape of the cushion plate may be freely and easily changed in response to a design change of the display module.

Effects of the present disclosure are not limited to the above-mentioned effects, and other effects as not mentioned will be clearly understood by those skilled in the art from following descriptions.

DETAILED DESCRIPTIONS

Figure 1A:
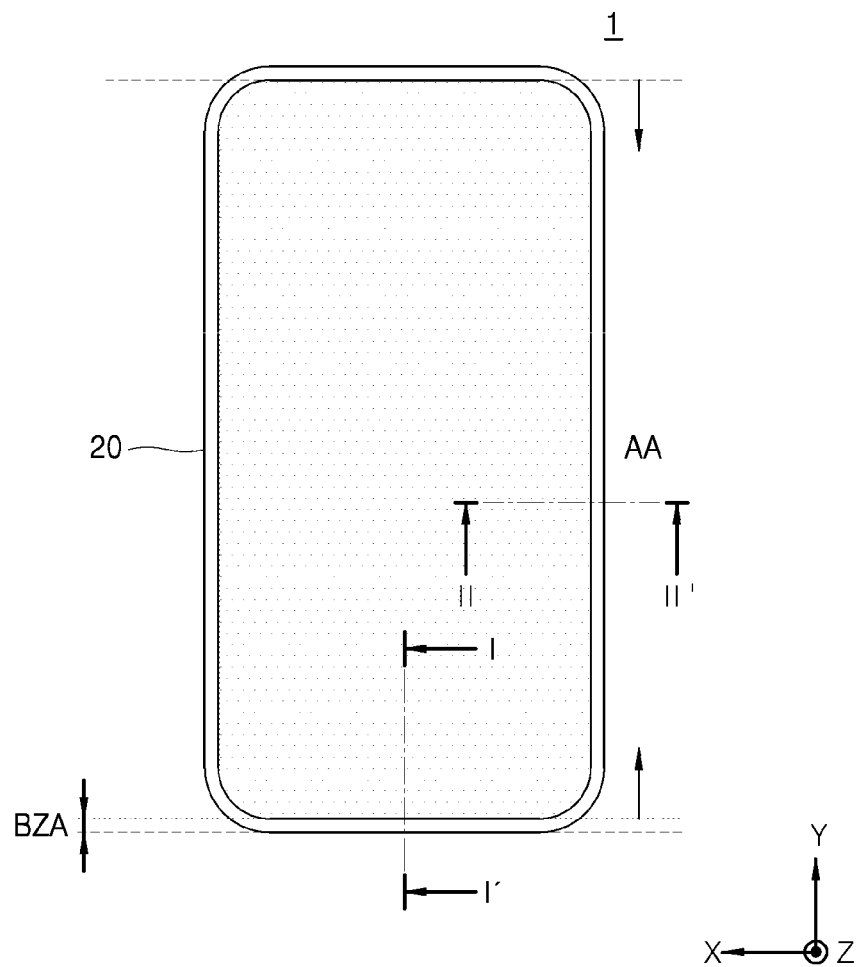
FIGS. 1A and 1B respectively show a upper surface and a lower surface of a display device according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs.

A shape, a size, a ratio, an angle, a number, etc., disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

In descriptions of temporal relationships, for example, temporal precedent relationships between two events such as "after," "subsequent to," "before," etc., another event may occur therebetween unless "directly after," "directly subsequent" or "directly before" is indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Hereinafter, various configurations of a display module and a display device that may improve a heat-dissipation performance and a shock absorption function while reducing a bezel area will be described in detail.

Figure 1B:
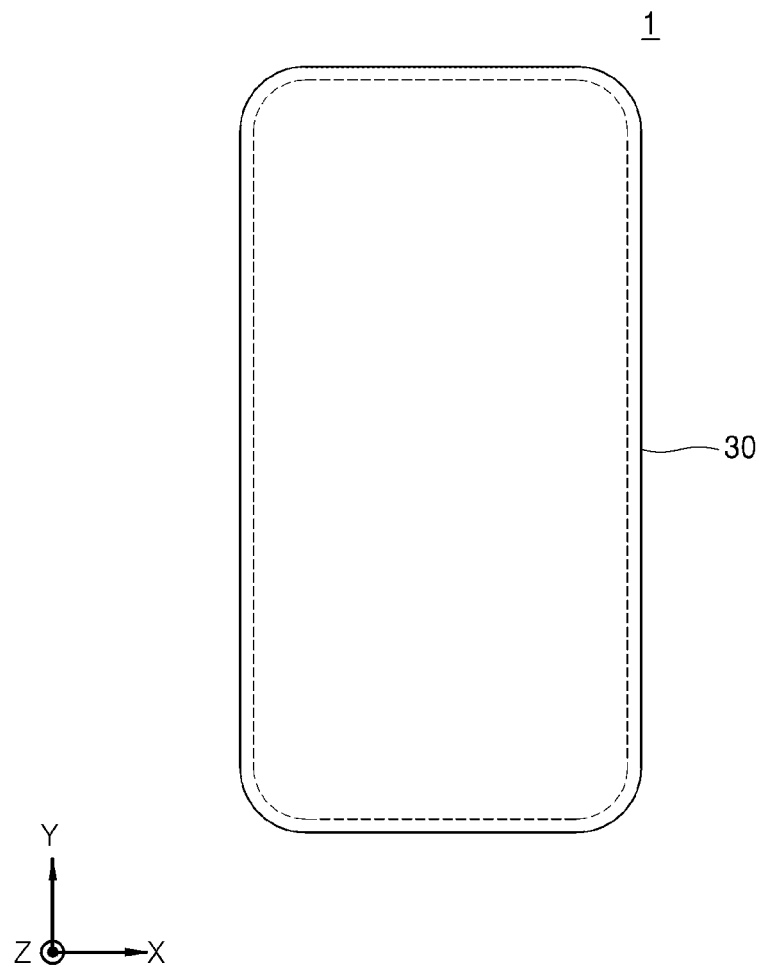

FIG. 1A briefly shows a upper surface of a display device 1 on which a display area AA is disposed, and FIG. 1B briefly shows a lower surface of display device 1.

Herein, a direction toward a upper surface and a upper refers to a Z-axis direction, while a direction toward a lower surface and a lower refers to a −Z-axis direction.

The display device 1 includes a cover member 20, a display module 10 coupled to a lower surface of cover member 20, and a frame 30 disposed on a lower surface of display module 10 to support the cover member 20.

The cover member 20 may be disposed to cover a upper surface of the display module 10, and thus may protect the display module 10 from external shocks.

An edge of the cover member 20 may have a round shape in which the edge thereof is curved toward a lower surface thereof on which the display module 10 is disposed.

In this case, the cover member 20 may cover at least a partial area of a side surface of display module 10 disposed on the lower surface thereof, thus protecting not only a upper surface of the display module 10, but also the side surface thereof from an external shock.

The cover member 20 includes the display area AA that displays a screen, and thus may be made of a transparent material such as a cover glass to display the screen. For example, the cover member 20 may be made of a transparent plastic material, a glass material, or a reinforced glass material.

The frame 30 may be disposed on the lower surface of the display module 10 and therein accommodate the display module 10 and contact the cover member 20 to support the cover member 20.

The frame 30 serves as a housing that defines a lower surface of an outermost portion of the display device 1, and may be made of various materials such as plastic, metal, or glass.

In this case, the frame 30 may function as a casing defining an outermost portion of display device 1. However, the present disclosure is not limited thereto.

For example, the frame 30 may function as a middle frame that serves as a housing that forms the lower surface of display module 10, and there may be an additional casing on the lower surface of the frame 30.

Further, the upper surface of the cover member 20 may be divided into the display area AA and the non-display area NAA as an area other than the display area AA. The non-display area NAA may be formed along an edge of the display area AA, and the non-display area NAA may be defined as a bezel area BZA.

The display module 10 coupled to the lower surface of the cover member 20 may have a bent portion BNP. The bent portion BNP may be disposed in the bezel area BZA blow the cover member 20 in a −Y-axis direction.

In order to reduce the bezel area BZA under the cover member 20, it is desirable to reduce a radius of curvature of the bent portion BNP.

The radius of curvature of the bent portion BNP is proportional to a total thickness of the display module 10 and the display device 1. Thus, as the total thickness increases, the radius of curvature of the bent portion BNP increases. When the total thickness decreases, the radius of curvature of the bent portion BNP decreases.

Therefore, in order not to increase the size of the bezel area BZA, it is desirable to prevent the total thickness of display module 10 and the display device 1 from increasing.

Hereinafter, the display module 10 according to an embodiment of the present disclosure will be described in detail with reference to FIG. 2 and FIG. 3.

The display module 10 is coupled to the lower surface of the cover member 20.

Figure 2:
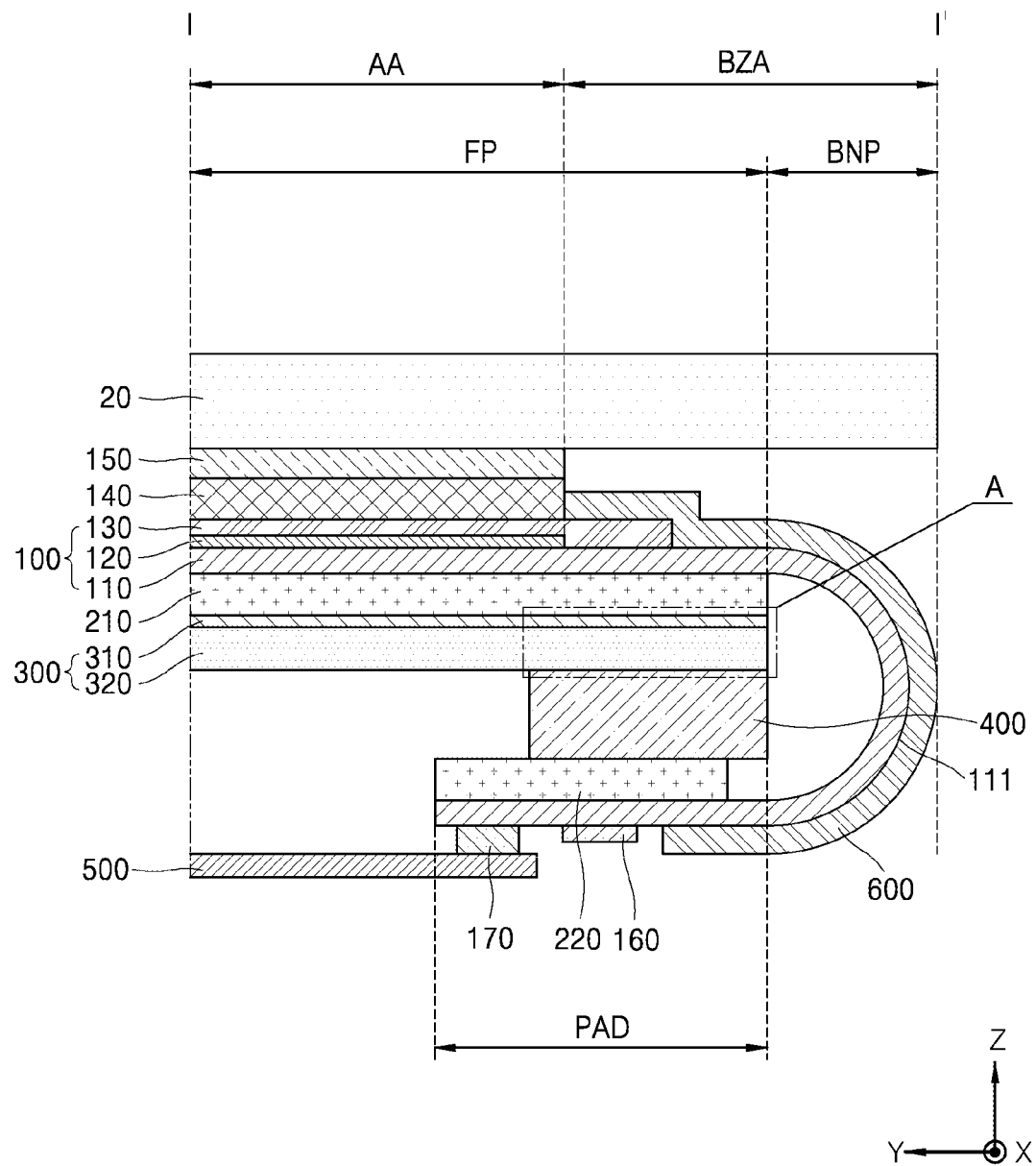
FIG. 2 is a cross-sectional view taken along a I-I' direction of a display module according to an embodiment of the present disclosure.

Referring to FIG. 2, the display module 10 includes a display panel 100 including a front portion FP, a bent portion BNP, and a pad portion PAD extending from the bent portion BNP and disposed below a lower surface of the front portion FP, a cushion plate 300 disposed between the front portion FP and the pad portion PAD, and a bent panel fixing member (or a second connection member) 400 that fixes the pad portion PAD to the cushion plate 300.

Specifically, under the front portion FP of the display panel 100, a first backplate (or a first plate) 210, the cushion plate 300, the bent panel fixing member 400, a second backplate (or a second plate) 220, and the pad portion PAD may be sequentially stacked in this order.

Figure 3:
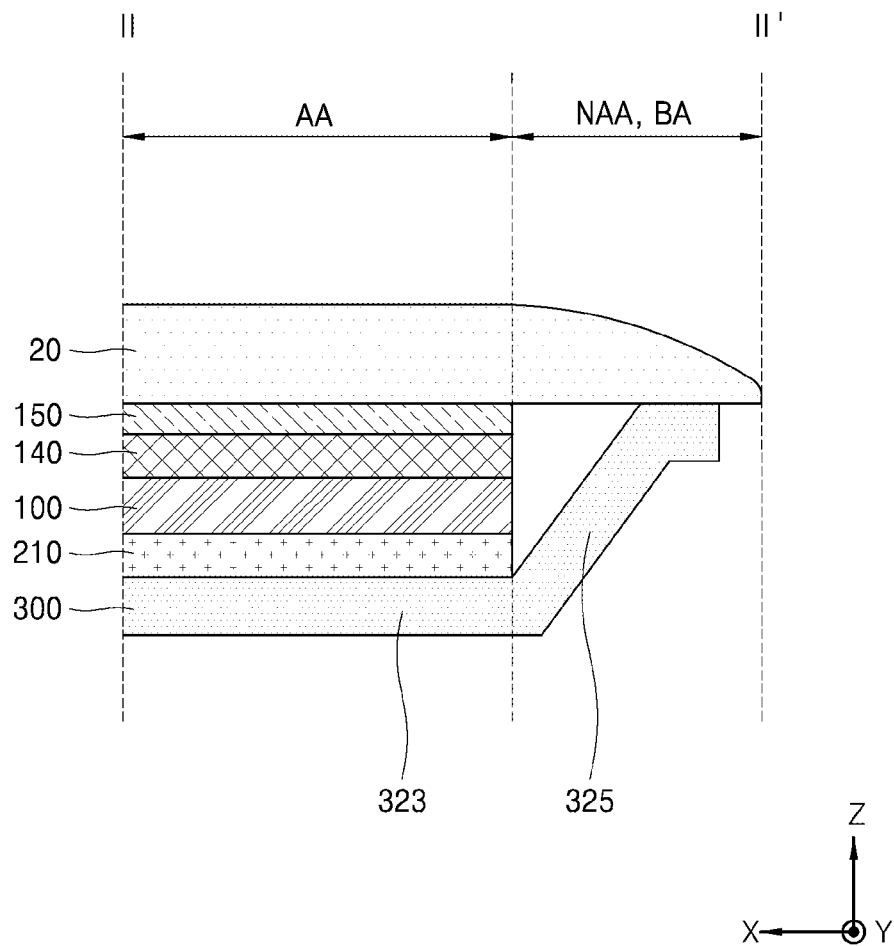
FIG. 3 is a cross-sectional view taken along a direction a II-II' of a display module according to an embodiment of the present disclosure.

Referring to FIG. 3, the display module 10 includes the display panel 100 and may further include various layers such as a functional film layer 140, a first back plate 210, and the cushion plate 300.

First, the display module 10, specifically a module fixing member (or a first connection member) 150 that fixes the display panel 100 to the cover member 20 is placed on the lower surface of the cover member 20.

Since the module fixing member 150 may be disposed to overlap the display area AA, the module fixing member 150 may be embodied as a transparent adhesive member or layer. For example, the module fixing member 150 may be made of or include a material such as OCA (Optical Clear Adhesive), OCR (Optical Clear Resin), or PSA (Pressure Sensitive Adhesive).

A functional film 140 may be additionally disposed between the module fixing member 150 and the display panel 100. The functional film 140 may have a structure in which one or more functional layers are stacked one on upper of another, but is not particularly limited.

In one example, the functional film 140 may include an antireflection layer such as a polarizing film that prevents reflection of external light to improve an outdoor visibility and a contrast ratio for an image displayed on the display panel 100.

In addition, in one example, the functional film 140 may further include a barrier layer for preventing moisture or oxygen invasion. The barrier layer may be made of a material having low moisture permeability, such as a polymer material.

The display panel 100 may include a display substrate 110, a pixel array 120 disposed on the display substrate 110, and an encapsulation portion 130 disposed to cover the pixel array 120.

The display substrate 110 may serve as a base substrate of the display panel 100. The display substrate 110 may be made of a flexible plastic material and thus may act as a flexible display substrate.

In one example, the display substrate may be made of polyimide as a plastic material having flexibility, or may be made of a thin-type glass material having flexibility.

The pixel array 120 may correspond to an area for displaying the image toward the upper surface of the cover member 20, and thus may correspond to the display area AA.

Therefore, the area corresponding to the pixel array 120 in the cover member 20 may be the display area AA, and the area other than the display area AA may be the bezel area BZA.

The pixel array 120 may be implemented using various elements that display an image, and may not be particularly limited.

The pixel array 120 may include a plurality of pixels that are arranged in a pixel area defined by signal lines on the display substrate 110, and display an image according to signals supplied to the signal lines. The signal lines may include a gate line, a data line, and a pixel driving power line.

Each of the plurality of pixels may include a driving thin film transistor in the pixel area, an anode electrically connected to the driving thin film transistor, a light-emissive element layer formed on the anode, and a cathode electrically connected to the light-emissive element layer.

The driving thin film transistor may include a gate electrode, a semiconductor layer, a source electrode, a drain electrode, and the like. The semiconductor layer of the thin film transistor may include silicon such as a-Si, poly-Si, or low-temperature poly-Si, or an oxide such as IGZO (Indium-Gallium-Zinc-Oxide).

The anode may be disposed in each pixel in a corresponding manner to an opening area defined according to a pattern shape of a pixel, and may be electrically connected to the driving thin film transistor.

In one example, the light-emissive element layer may include an organic light-emissive element formed on the anode. The organic light-emissive element may be implemented to emit light of the same color such as white light across the pixels or may be implemented to emit light beams of different colors such as red, green, and blue light beams across the pixels.

In another example, the light-emissive element layer may include a micro light-emissive diode element electrically connected to each of the anode and the cathode. The micro light-emissive diode element refers to a light-emissive diode implemented in a form of an integrated circuit (IC) or a chip, and may include a first terminal electrically connected to the anode and a second terminal electrically connected to the cathode.

The cathode may be commonly connected to a light-emissive element of a light-emissive element layer disposed in each pixel area.

The encapsulation portion 130 is formed on the display substrate 110 to cover the pixel array 120, such that oxygen, moisture, or foreign substances may be prevented from invading into the light-emissive element layer of the pixel array 120. In one example, the encapsulation portion 130 may be formed in a multilayer structure in which organic material layers and inorganic material layers are alternately stacked one on upper of another.

The display panel 100 may be divided into the front portion FP, the bent portion BNP, and the pad portion PAD.

The front portion FP of the display panel 100 constitutes a surface on which the screen is displayed. The pad portion PAD extends from the bent portion BNP toward a lower of the front portion FP, and thus is disposed under the front portion FP.

Specifically, when the display panel 100 is bent, the pixel array 120 and the encapsulation portion 130 constitute the front portion FP and thus are not bent, and a partial area of the display substrate 110 corresponding to the pad portion PAD is bent from the bent portion BNP toward the lower surface of the front portion FP.

The first backplate 210 may be disposed under the front portion FP of the display panel 100.

The first backplate 210 is disposed under the display substrate 110 to supplement rigidity of the display substrate 110, while maintaining a portion of the display substrate 110 constituting the front portion FP in a flat state.

Since the first backplate 210 is formed to have a certain strength and a certain thickness to supplement the rigidity of the display substrate 110, the first backplate 120 may not be formed in a portion of the display panel 100 constituting the bent portion BNP.

In one example, the second backplate 220 is disposed on a upper surface of the pad portion PAD of the display panel 100 which extends from the bent portion BNP of the display panel 100 and is disposed below the lower surface of the front portion FP.

Before the display panel 100 is bent, the second backplate 220 is placed under the display substrate 110 and is spaced apart from the first backplate 210.

Specifically, the second backplate 220 is placed under the pad portion PAD of the display panel 100.

The second backplate 220 is disposed under the display substrate 110 to supplement the rigidity of the display substrate 110, while maintaining a portion of the display substrate 110 constituting the pad portion PAD in a flat state.

Since the second backplate 220 is formed to have a certain strength and a certain thickness to supplement the rigidity of the display substrate 110, the second backplate 120 may not be formed in a portion of the display panel 100 corresponding to the bent portion BNP.

After the display panel 100 is bent, the second backplate 220 is placed on a upper surface of the pad portion PAD of the display panel 100, and is disposed between the front portion FP and the pad portion PAD.

In other words, while the display panel 100 is bent, the second backplate 220 is placed under the front portion FP of the display panel 100, and is placed on a upper surface of the pad portion PAD of the display panel 100.

The cushion plate 300 may be disposed under the first backplate 210.

The cushion plate 300 includes an embossed layer 310, and a metal foam 320. Specifically, the metal foam 320 with a predefined thickness is laminated on one surface of the embossed layer 310.

Referring to FIG. 2, based on an arrangement of the display module 10, the metal foam 320 is disposed on a lower surface of the embossed layer 310.

Hereinafter, the cushion plate 300 according to a first embodiment of the present disclosure will be described in detail with reference to FIG. 3.

First, the embossed layer 310 may refer to a layer that directly contacts the first backplate 210 to fix the cushion plate 300 to the first backplate 210, and thus may function as an adhesive layer containing an adhesive component. In this case, a surface of the embossed layer 310 may be formed with a plurality of embossed patterns. For example, a surface of the embossed layer 310 contacting the first backplate 210 may include a plurality of embossed patterns. However, the present disclosure is not limited to it.

The embossed layer 310 may be made of or include a material such as OCA (Optical Clear Adhesive), OCR (Optical Clear Resin), or PSA (Pressure Sensitive Adhesive).

Specifically, the embossed layer 310 may include a base substrate 311, and a first adhesive layer 311a and a second adhesive layer 311b disposed on both opposite surfaces of the base substrate 311, respectively.

In this case, the second adhesive layer 311b may contact the metal foam 320 to bond and fix the metal foam 320 to the embossed layer 310.

The first adhesive layer 311a of the embossed layer 310 may have a plurality of embossed patterns 313e such as an uneven structure. That is, an upper surface of the first adhesive layer 311a of the embossed layer 310 may include a plurality of embossed patterns 313e.

The upper surface of the first adhesive layer 311a of the embossed layer 310 may act as a surface in contact with the first backplate 210. The first adhesive layer 311a has the embossed patterns 313e, thereby preventing production of air bubbles between the first backplate 210 and the cushion plate 300, such that a degassing process for removing air bubbles may be omitted.

The base substrate 311 of the embossed layer 310 may serve to hold a shape of the embossed layer 310, and may be made of a material such as PET.

In order to have an effective anti-bubble effect, the embossed layer 310 preferably has a thickness of at least 40 µm.

The metal foam 320 is disposed on one surface of the embossed layer 310.

The metal foam 320 may refer to a porous metal structure containing metal as a main component, and the metal foam 320 may have a plurality of pores 321 therein.

That is, the metal foam 320 may refer to a porous metal structure having a plurality of pores 321 therein.

The metal foam 320 may be formed using a following manufacturing method by way of example. However, the present disclosure is not limited thereto.

The metal foam 320 may be formed by sintering a metal foam precursor containing metal powders.

The metal foam precursor refers to a structure before proceeding with a process performed to form the metal foam 320 such as the sintering process.

For example, the metal foam precursor may be formed using a slurry containing metal powders, dispersant, and binder.

The metal powder may be embodied as mixture metal powers or alloy powders between at least two selected from a group consisting of copper powder, nickel powder, iron powder, SUS powder, molybdenum powder, silver powder, platinum powder, gold powder, aluminum powder, chromium powder, indium powder, tin powder, magnesium powder, phosphorous powder, zinc powder, and manganese powder. However, the present disclosure is not limited thereto.

In one example, alcohol may be used as the dispersant. However, the present disclosure is not limited thereto.

In this case, the alcohol may include monohydric alcohol having 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol or terpineol, or a dihydric alcohol having 1 to 20 carbon atoms such as ethylene glycol, propylene glycol, hexanediol, octanediol or pentanediol, or polyhydric alcohols other than dihydric alcohol. However, the present disclosure is not limited thereto.

A type of the binder is not particularly limited and may be appropriately selected according to a type of a metal component or the dispersant used in preparation of the slurry.

For example, the binder may include an alkyl cellulose having an alkyl group having 1 to 8 carbon atoms such as methyl cellulose or ethyl cellulose, polyalkylene carbonate having an alkylene unit having 1 to 8 carbon atoms such as polypropylene carbonate or polyethylene carbonate, or a polyvinyl alcohol-based binder such as polyvinyl alcohol or polyvinyl acetate. However, the present disclosure is not limited thereto.

After producing the slurry containing the metal powder, the dispersant, and the binder as described above, the slurry may be injected into a frame having a predefined shape or coating the slurry on the substrate, thereby forming the metal foam precursor.

The metal foam precursor as thus formed may be changed into the metal foam 320 via the sintering process.

In this case, a condition of the sintering process is not particularly limited as long as the process proceeds at a temperature and for a time duration to allow solvent contained in the slurry to be removed at a desired amount.

In one example, the sintering temperature may be in a range of about 50° C. to 250° C. and the sintering time duration may be predefined. However, the present disclosure is not limited thereto.

According to an embodiment of the present disclosure, after forming the metal foam precursor on the embossed layer 310, the sintering process may be performed to form the metal foam 320, thereby forming the cushion plate 300 including the embossed layer 310 and the metal foam 320.

Alternatively, after forming the metal foam 320 separately from the embossed layer 310, the embossed layer 310 and the metal foam 320 may be bonded to each other, thereby forming the cushion plate 300 including the embossed layer 310 and the metal foam 320. Thus, the manufacturing method of the cushion plate 300 is not particularly limited.

Figure 7:
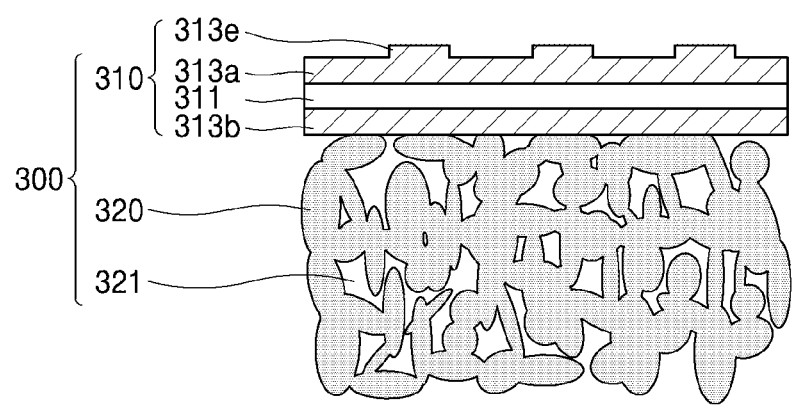
FIG. 7 to FIG. 16 are enlarged cross-sectional views of an area A of FIG. 2, and are enlarged cross-sectional views of cushion plates according to a first embodiment to a tenth embodiment of the present disclosure, respectively.

Using this manufacturing process, the cushion plate 300 according to the first embodiment of the present disclosure may be formed as shown in FIG. 7.

In the cushion plate 300 including the embossed layer 310 and the metal foam 320, the metal foam 320 as a metal structure having a multiple of pores 321 therein may have a heat-dissipation function and a cushion function at the same time.

The metal foam 320 is made of metal with a high thermal conductivity, such that the metal foam 320 itself exhibits excellent heat-dissipation function. Since the metal foam has the metal structure having a multiple of pores 321 therein, the metal foam may also realize excellent cushioning function.

In particular, because the metal foam 320 has a metal structure having a multiple of pores 321 therein, an overall surface area thereof may increase, and thus, the metal foam 320 itself may realize the excellent heat-dissipation function.

Therefore, the cushion plate 300 according to an embodiment of the present disclosure has both of an effective heat-dissipation function and an effective cushion functions at the same time using only the metal foam 320 without having a heat-dissipation layer for a heat-dissipation function and a cushion layer for a cushion function as separate layers.

Figure 17A:
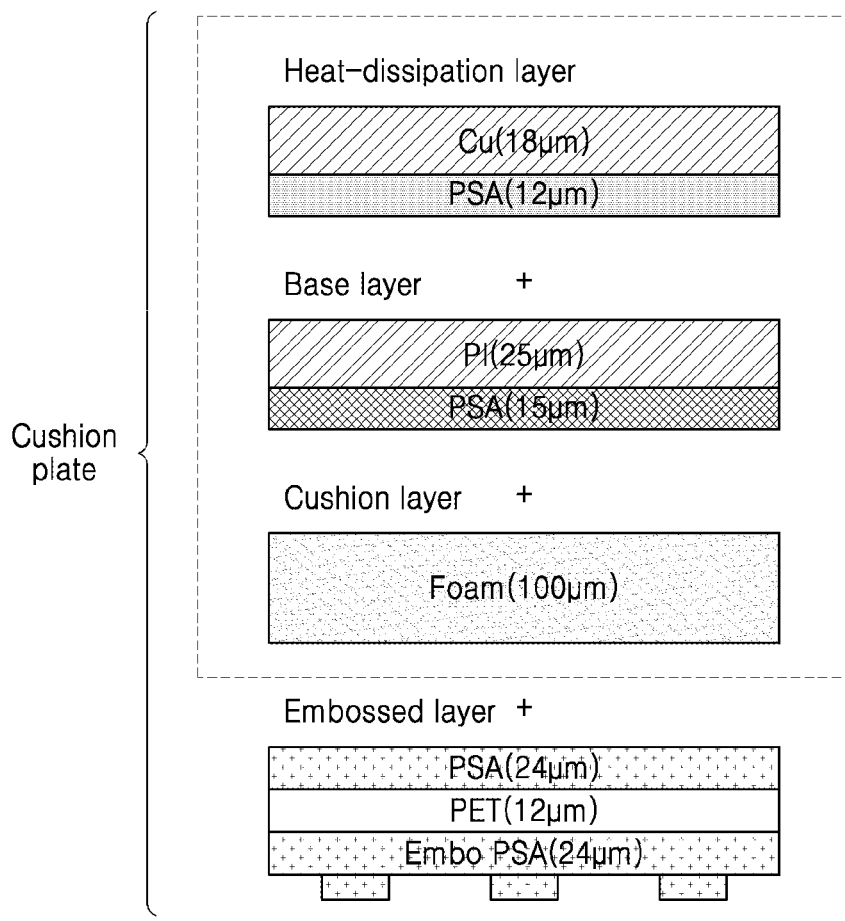
FIG. 17A and FIG. 17B are comparative cross-sectional views of laminated structures of cushion plates according to Comparative Example, and an embodiment of the present disclosure, respectively.
Figure 17B:
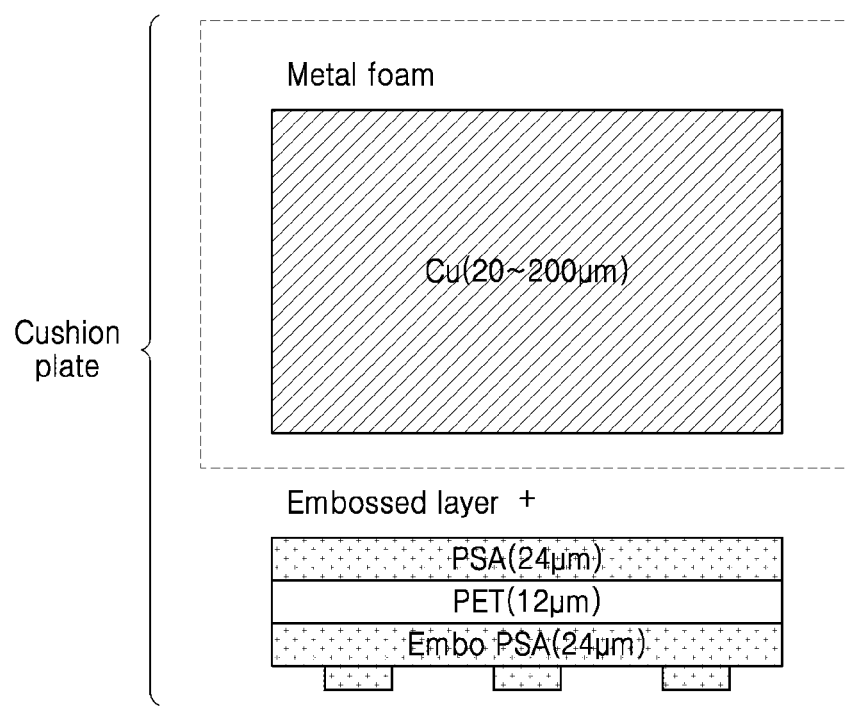

In this regard, referring to FIGS. 17A and 17B, FIG. 17A shows Comparative Example of a cushion plate 300 having a four-layers laminated structure. FIG. 17B shows a cross-sectional view of a cushion plate 300 having a two-layers laminated structure including the metal foam 320 according to an embodiment of the present disclosure.

As shown in FIG. 17A, the cushion plate according to Comparative Example has a structure in which four layers are laminated by sequentially stacking a cushion layer, a base layer, and a heat-dissipation layer on an embossed layer.

The embossed layer may include a base substrate made of PET, and a first adhesive layer PSA and a second adhesive layer PSA on both opposing surfaces of the base substrate, respectively, wherein the second adhesive layer may be embodied as an embossed adhesive layer Embo PSA.

In this case, the base substrate of the embossed layer may have a thickness of about 12 μm, and each of the first adhesive layer and the second adhesive layer may have a thickness of about 24 μm.

A cushion layer as a foam pad portion may be formed on the embossed layer to impart a cushion function to the cushion plate.

In this case, the cushion layer should have a thickness of at least 100 μm in order to provide minimum effective cushioning function using only the foam pad.

The heat-dissipation layer is formed on the cushion layer, and the base layer must be added between the cushion layer and the heat-dissipation layer.

The heat-dissipation layer is directly bonded to the cushion layer. In this case, when the cushion plate is bent in a bent area of the display module and then a time lapses, the cushion layer and the heat-dissipation layer made of different materials from each other are not completely adhered to each other, and are separated from each other.

Accordingly, the base layer may be added between the cushion layer and the heat-dissipation layer to minimize the separation between the cushion layer and the heat-dissipation layer and to realize flexibility in the bent area.

The base layer may be formed by disposing an adhesive layer PSA on a flexible base made of polyimide (PI).

In this case, in order for the base layer to achieve minimum effective separation-suppressing and support functions, the base made of the polyimide should have a thickness of at least 25 μm, and a thickness of the adhesive layer PSA included in the base layer should be at least 15 μm.

The heat-dissipation layer is disposed on the base layer to impart a heat-dissipation function to the cushion plate 300.

The heat-dissipation layer may be formed by disposing an adhesive layer PSA on a metal layer made of a material having good thermal conductivity such as copper.

In this case, in order for the heat-dissipation layer to achieve minimum effective heat-dissipation function, the metal layer must have a thickness of at least 18 μm, and a thickness of the adhesive layer PSA included in the heat-dissipation layer should be at least 12 μm.

In other words, the cushion plate according to Comparative Example may have a structure in which the four layers are laminated, that is, the layers having separate functions must be stacked one on upper of another in order to provide both of the heat-dissipation function and the cushion function. Thus, the number of process steps may increase, thus leading to an increase in a manufacturing cost of the module.

In particular, the layers having different functions are made of different materials. Thus, additional adhesive layers must be disposed between the layers in order to bond the layers to each other. Thus, a total thickness of the cushion plate may be further increased.

To the contrary, as shown in FIG. 17B, the cushion plate 300 according to an embodiment of the present disclosure may achieve both of an effective heat-dissipation function and an effective cushion function only using a double-layer laminated structure in which the metal foam 320 and the embossed layer 310 are stacked one on upper of the other.

That is, because the cushion plate 300 according to an embodiment of the present disclosure may realize both the heat-dissipation function and the cushion function using only the metal foam 320, there is no need to stack separate layers made of different materials having a heat-dissipation function and a cushion function, respectively, so that separation between the layers, and adhesion deterioration therebetween may be minimized.

In addition, there is no need to add a separate adhesive layer for fixing the layers to each other. Thus, the increase in the manufacturing cost of the module due to the increase in the thickness due to the adhesive layer or the addition of various layers may not occur.

In this case, a thickness of the metal foam 320 may be in a range of 20 μm to 200 μm, and a thickness of the cushion plate 300 may be in a range of 80 μm to 260 μm.

In particular, even when the metal foam 320 of the cushion plate 300 according to an embodiment of the present disclosure has a minimum thickness of 20 μm, the metal foam 320 may have both a heat-dissipation function and a cushion function. Thus, a total thickness of the cushion plate 300 may be reduced.

The minimum and maximum thicknesses of each of the metal foam 320 and the cushion plate 300 may be appropriately selected according to a shape change of the display module 10.

As described above, the cushion plate 300 according to an embodiment of the present disclosure includes the metal foam 320 having a higher freedom in the shape change. Thus, in response to the design change of the display module 10, the shape of the cushion plate 300 may be freely and easily changed.

That is, the metal foam 320 has a very excellent heat-dissipation function and a very excellent cushioning function only at a small thickness thereof, such that a total thickness of the cushion plate 300 may be greatly reduced, and thus the bezel area may be reduced.

Hereinafter, the cushion plate 300 according to an embodiment of the present disclosure that may suppress greenish defect of the display module 10 and the display device 1 will be described in detail with reference to FIGS. 3 and 4A to 4C.

The cushion plate 300 according to an embodiment of the present disclosure includes a body 323 and at least one protrusion 325 extending along and protruding from at least one edge portion of the body 323.

The protrusion 325 of the cushion plate 300 is in contact with the cover member 20.

Figure 4A:
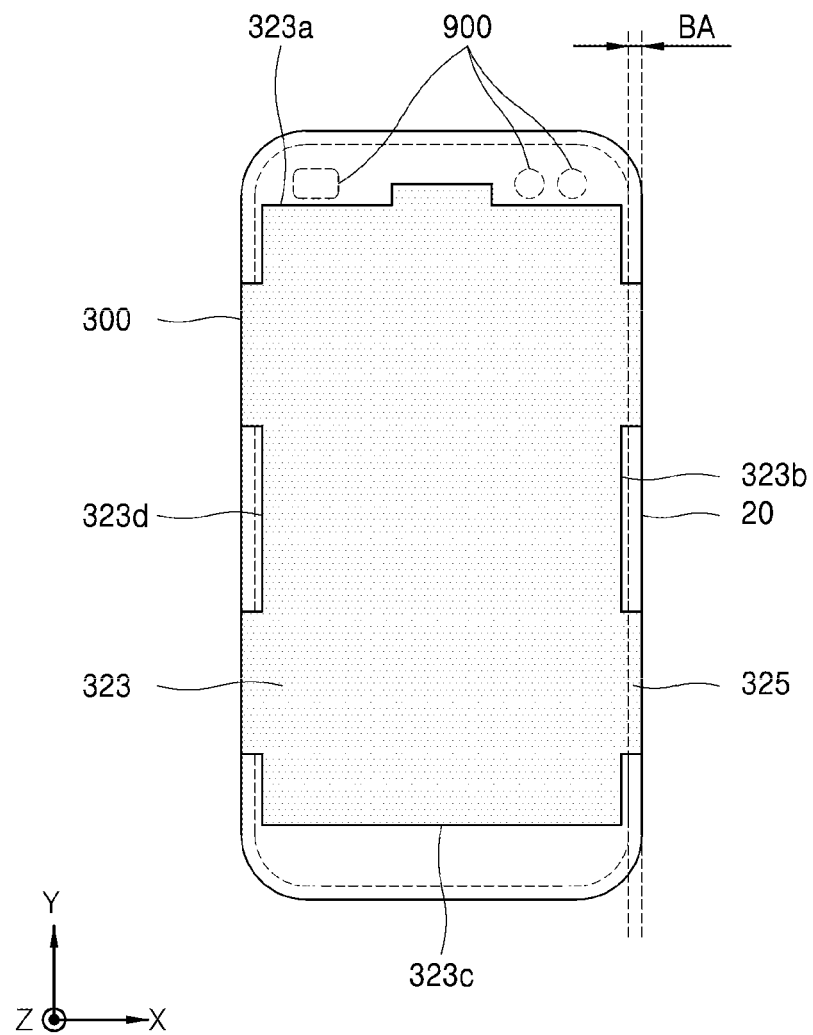
FIG. 4A to FIG. 4C are plan views of cushion plates according to various embodiments of the present disclosure, respectively.

In one example, as shown in FIG. 4A, the cushion plate 300 may have four edge portions such as a first edge portion 323a, a second edge portion 323b, a third edge portion 323c, and a fourth edge portion 323d.

However, the number of edge portions is not limited thereto, and may vary according to a shape of the cushion plate 300.

The first edge portion 323a may be disposed at a upper of the display module 10, the second edge portion 323b and the fourth edge portion 323d may be respectively disposed at left and right sides of the display module 10, and the third edge portion 323c may be disposed at a lower of the display module 10.

As shown in the embodiment shown in FIG. 4A, one protrusion 325 protrudes from the first edge portion 323a of the body 323 of the cushion plate 300, and two protrusions protrude from each of the second edge portion 323b and the fourth edge portion 323d thereof.

A portion of the display module 10 adjacent to the first edge portion 323a may have at least one through-hole 900 defined therein into which a component such as a camera module or various sensor modules may be inserted.

Since the component must be inserted in the through-hole 900, the protrusion 325 of the cushion plate 300 may be formed so as not to cover the through-hole 900.

Therefore, the protrusion 325 on the first edge portion 323a may be formed in a pattern that does not overlap with the through-hole 900, and thus may not interfere with the through-hole 900.

Each of the protrusions 325 on the second edge portion 323b may have a predefined length. The protrusions 325 on the second edge portion 323b may be spaced apart from each other. Each of the protrusions 325 on the fourth edge portion 323d may have a predefined length. The protrusions 325 on the fourth edge portion 323d may be spaced apart from each other.

In this case, the protrusions 325 on each of the second edge portion 323b and the fourth edge portion 323d may be formed in a pattern which may not interfere with other components in the display module 10 and the display device 1.

Therefore, the number and lengths of the protrusions 325 formed on one edge portion are not particularly limited and may vary according to a design choice of the display module 10 and the display device 1.

Figure 4B:
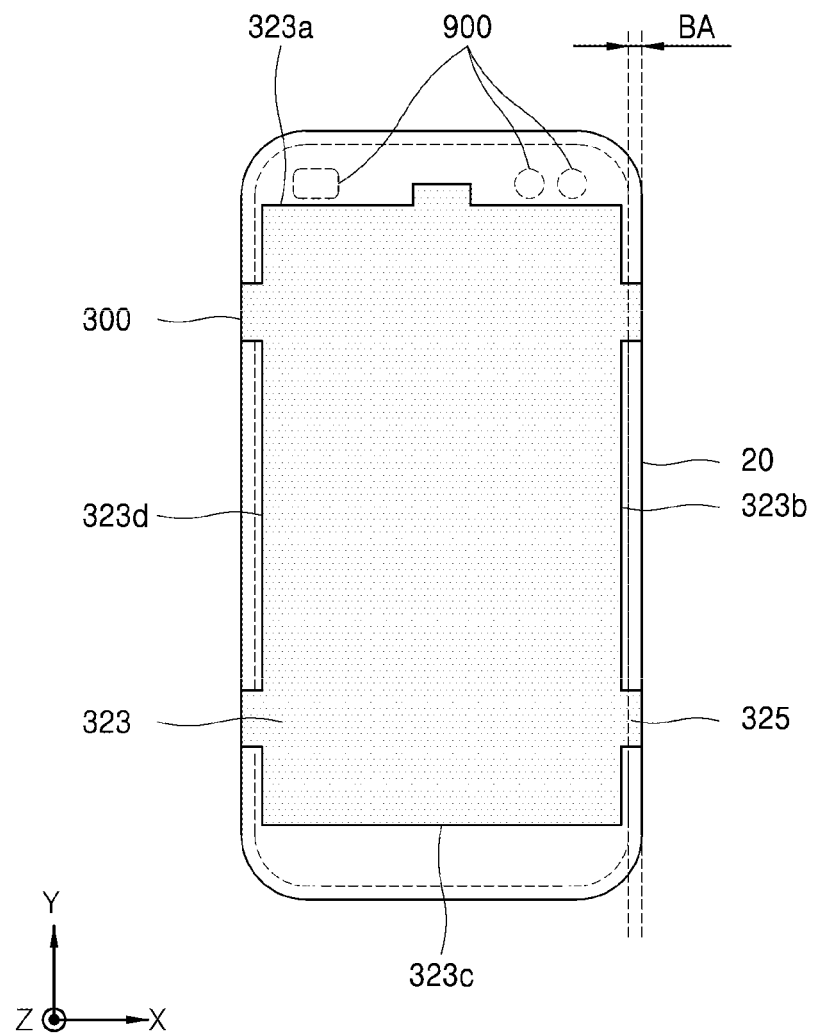

For example, as in an embodiment shown in FIG. 4B, each of the protrusions 325 on the first edge portion 323a, the second edge portion 323b, and the fourth edge portion 323d of the cushion plate 300 may have a length smaller than that of each of the protrusions 325 of the cushion plate 300 according to FIG. 4A.

Figure 4C:
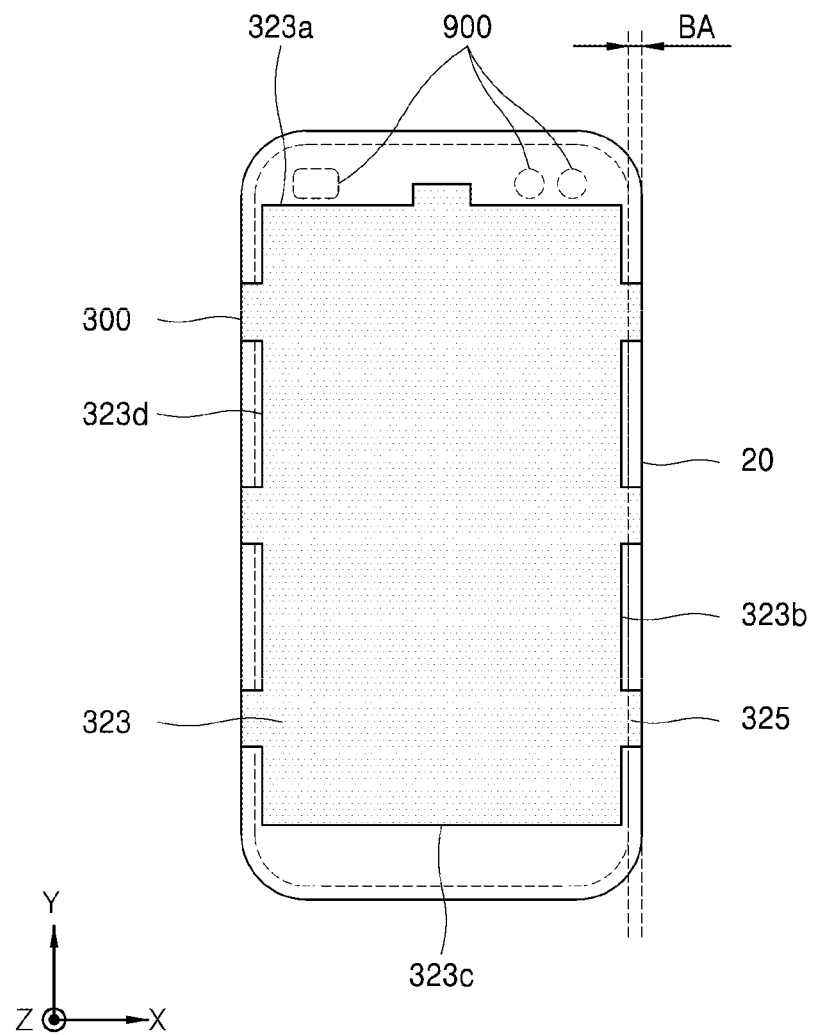

Further, as in an embodiment according to FIG. 4C, three protrusions 325 may protrude from each of the second edge portion 323b and the fourth edge portion 323d of the body 323 of the cushion plate 300.

In this case, each of the protrusions 325 of the cushion plate 300 according to FIG. 4C may have a length smaller than that of each of the protrusions 325 of the cushion plate 300 according to FIG. 4A.

That is, as long as the protrusion 325 of the cushion plate 300 comes into contact with the cover member 20 and transfers the electric charge generated on the cover member 20 to the cushion plate 300 through the protrusions 325, the number, a shape, and a length of the protrusion 325 are not particularly limited.

As described above, the protrusion 325 of the cushion plate 300 may be formed along at least one edge portion. At least one protrusion 325 may be formed on each edge portion.

However, the protrusion 325 may not be formed on the third edge portion 323c of the cushion plate 300 adjacent to a lower end of the display module 10.

As described above, the display panel 100 may include the front portion FP, the bent portion BNP, and the pad portion PAD extending from the bent portion BNP and disposed below a lower surface as shown in FIG. 2.

In addition, the cushion plate 300 disposed below the lower surface of the front portion FP of the display panel 100 may be disposed between the front portion FP of the display panel 100 and the pad portion PAD thereof.

In this case, the edge portion adjacent to the bent portion BNP among the edge portions of the cushion plate 300 may be prevented from direct contact with the cover member 20 due to the presence of the bent portion BNP of the display panel 100.

Therefore, the protrusion 325 may not be formed on the third edge portion 323c of the cushion plate 300 adjacent to the bent portion BNP of the display panel 100 among the edge portions of the cushion plate 300.

The protrusion 325 of the cushion plate 300 may contact the lower surface of the cover member 20.

Specifically, the protrusion 325 of the cushion plate 300 may contact an edge area BA of the lower surface of the cover member 20.

The edge area BA of the cover member 20 may correspond to a non-display area NAA other than a display area AA of the cover member 20 corresponding to the display area AA of the display panel 100.

The non-display area NAA may be formed along an outer periphery of the display area AA.

Therefore, the edge area BA of the cover member 20 may be contained in the non-display area NAA and may be formed along the outer periphery of the display area AA.

Specifically, the edge area BA of the cover member 20 may correspond to the non-display area NAA from a distal end of the cover member 20 to a boundary line between the non-display area NAA and the display area AA.

The protrusion 325 of the cushion plate 300 may directly contact the edge area BA of the lower surface of the cover member 20, so that the electric charge flowing into the cover member 20 may be discharged out of the display module through the cushion plate 300.

The cushion plate 300 may be connected to a ground.

Therefore, the electric charge introduced from the cover member 20 into the cushion plate 300 may pass through the protrusion 325 of the cushion plate 300 and be discharged out of the display module 10 through the ground.

The protrusion 325 of the cushion plate 300 may be formed to be bent from the body 323 toward the lower surface of the cover member 20.

In this case, the protrusion 325 of the cushion plate 300 may have an inclined part as shown in FIG. 3.

Accordingly, the protrusion 325 of the cushion plate 300 may not directly contact the first backplate 210, the display panel 100 and the functional film 140 on the front surface of the cushion plate 300.

Accordingly, the module fixing member 150 and the protrusion 325 may contact the lower surface of the cover member 20, while the protrusion 325 may be spaced apart from the module fixing member 150 by a predetermined distance.

That is, a distal end of the protrusion 325 of the cushion plate 300 in contact with the cover member 20 may be coplanar with the module fixing member 150 disposed on the lower surface of the cover member 20, while the protrusion 325 may be spaced from the module fixing member 150 by a predetermined distance.

The protrusion 325 of the cushion plate 300 having such a structure may not contact a side surface of the display panel 100.

The protrusion 325 of the cushion plate 300 may contact the cover member 20 and thus may act as a charge discharge path that transfers the charge flowing into the cover member 20 to the body 323 of the cushion plate 300.

If the protrusion 325 of the cushion plate 300 is in contact with the side surface of the display panel 100, the charge discharge path comes in contact with the display panel 100, such that some of charges passing through the protrusion 325 may be introduced to the display panel 100.

However, as in an embodiment of the present disclosure, the protrusion 325 of the cushion plate 300 acting as the charge discharge path of the cover member 20 may be bent from the body 323 to have an inclined part so that the protrusion does not contact the side surface of the display panel 100. Thus, in the process of discharging the charges through the charge discharge path out of the display module, inflow of the charges into the display panel 100 may be greatly reduced.

Further, the body 323 and the protrusion 325 of the cushion plate 300 according to an embodiment of the present disclosure may not be embodied as separate components which may be connected to each other, but may be formed integrally with each other.

Specifically, since the metal foam 320 of the cushion plate 300 acts as the body 323 and the protrusion 325, the body 323 and the protrusion 325 may be integrally formed into one metal foam 320.

That is, in the cushion plate 300 according to an embodiment of the present disclosure, the integral metal foam 320 acts as the body 323 and the protrusion 325. Thus, the charge discharge path may be effectively formed by simply changing a shape of the metal foam 320 of the cushion plate 300 without adding an additional process or an additional component.

Therefore, since the cushion plate 300 itself acts as the charge discharge path, a process for discharging the charges may be simplified and a material cost may be reduced.

Further, since the charge discharge path is formed only by changing the shape of the metal foam 320 of the cushion plate 300, the defect may be suppressed which may otherwise occur when the charge discharge path is formed using a separate process.

Figure 5:
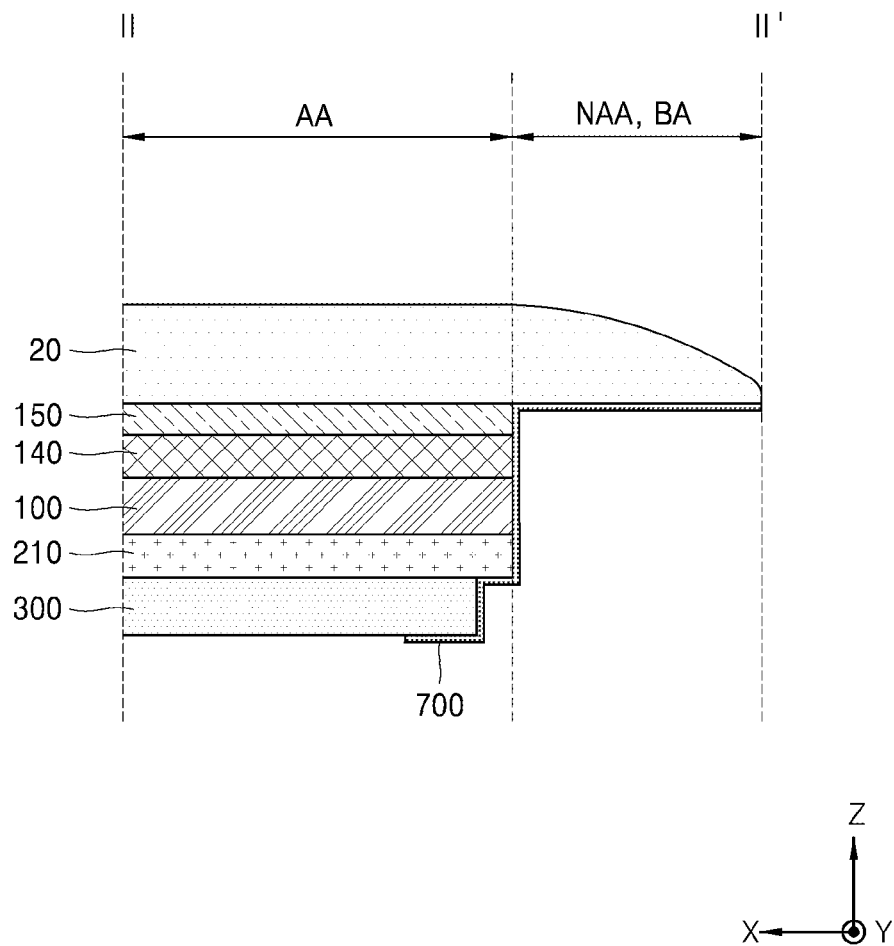
FIG. 5 is a cross-sectional view of a charge discharge path formed using conductive solution according to Comparative Example.

FIG. 5 shows Comparative Example in which a charge discharge path is formed by applying conductive solution to a cover member 20.

As shown in FIG. 5, in the display module 10 according to Comparative Example, the cushion plate 300 disposed on a lower surface of the display panel 100 does not directly contact the cover member 20.

In this case, the cushion plate 300 and the cover member 20 must be electrically connected to each other to discharge the charge flowing into the cover member 20 out of the display module.

Therefore, the charge discharge path through the cushion plate 300 may be formed by applying conductive solution 700 on an area between the cushion plate 300 and the edge area BA of the cover member 20, and on the edge area BA of the cover member 20.

That is, even when the conductive solution 700 is used, the charge discharge path capable of discharging the charges introduced into the cover member 20 out of the display module through the cushion plate 300 may be formed.

However, when forming the charge discharge path using the conductive solution 700, a separate process of applying the conductive solution 700 must be added in a separate manner from a process of forming the cushion plate 300. Thus, the process may be cumbersome.

FIGS. 6A to 6D show a process diagram of a process of applying the conductive solution 700 according to Comparative Example of FIG. 5.

Figure 6A:
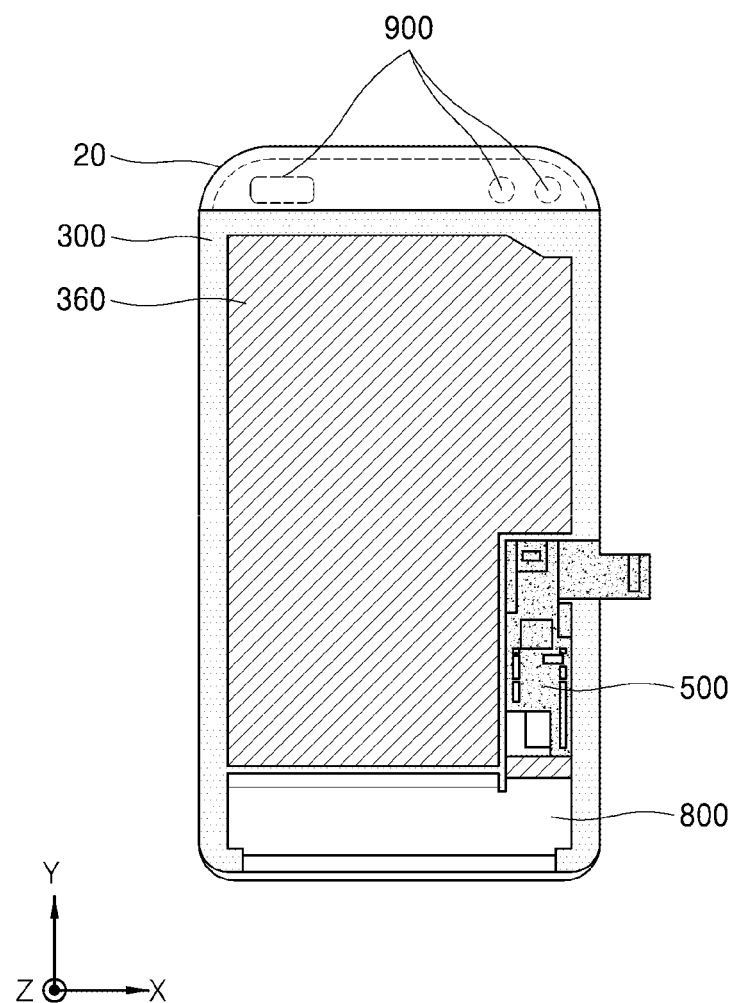
FIG. 6A to FIG. 6D show a process chart of applying the conductive solution according to FIG. 5.

First, as shown in FIG. 6A, in the display module 10, the display panel 100 is placed on the lower surface of the cover member 20, and the cushion plate 300 and a cushion plate protective film 360 are placed on a lower surface of display panel 100.

Further, a cover shield 800 covering a flexible circuit board 500 of the display module 10 is formed at a lower end of the display module 10.

In this case, at least a partial area of the flexible circuit board 500 may be covered with the cover shield 800, whereas a remaining area that is not covered therewith may extend beyond one edge portion of the cover member 20.

In this case, in order to form the charge discharge channel for discharging the charge from the cover member 20 to the cushion plate 300, the conductive solution 700 must be formed on the edge area BA of the cover member 20. However, due to the presence of the flexible circuit board 500, it is difficult to directly apply the conductive solution 700.

Figure 6B:
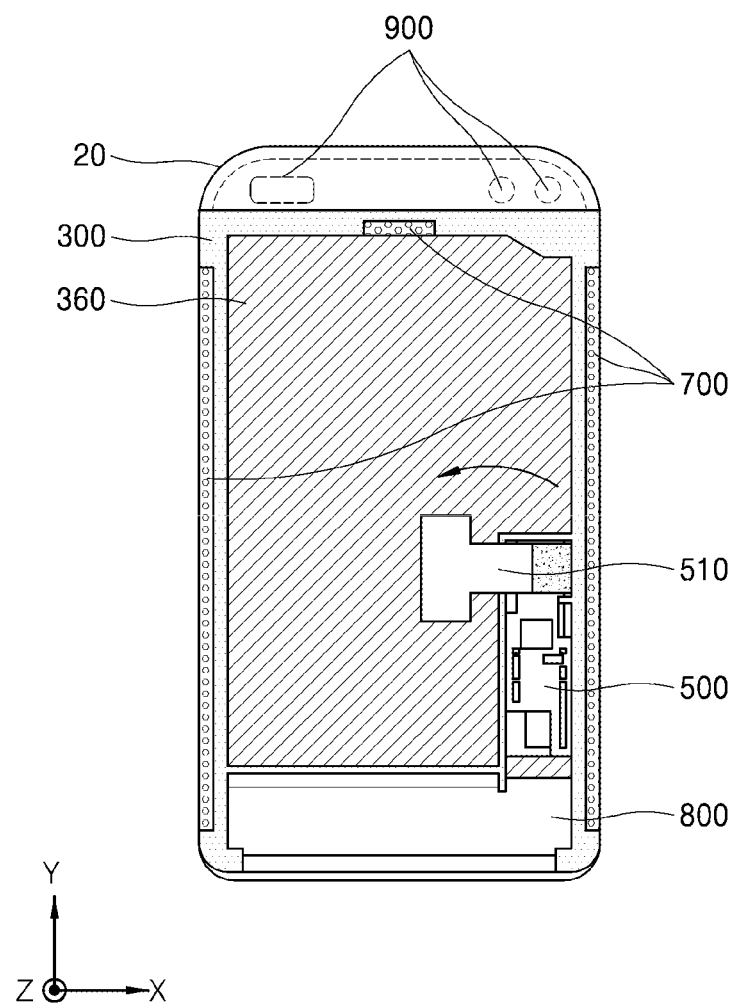

Accordingly, as shown in FIG. 6B, one end of the flexible circuit board 500 that extends beyond the edge portion of the cover member 20 is bent inwardly of the cover member 20 and is fixed to a lower surface of the cushion plate protective film 360 using a flexible circuit board fixing tape 510.

When bending the end of the flexible circuit board 500 extending beyond the edge portion of the cover member 20 inwardly of the cover member 20 and fixing the end thereof to the lower surface of the cushion plate protective film 360 using the flexible circuit board fixing tape 510, an area on which the conductive solution 700 may be applied to electrically connect the edge area BA of the cover member 20 with the cushion plate 300 may be secured.

Accordingly, as shown in FIG. 6B, applying the conductive solution 700 onto a upper surface of the cover member 20 and both opposing edge areas BA may result in formation of the charge discharge channel as shown in FIG. 5.

Figure 6C:
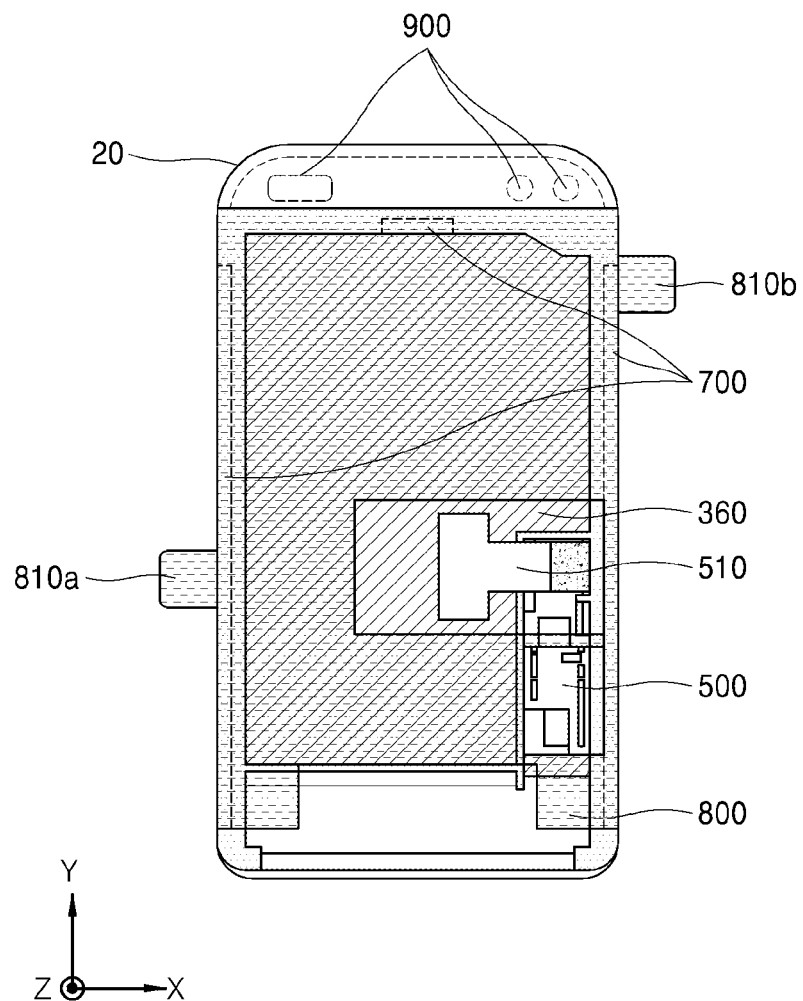

Next, as shown in FIG. 6C, additional protective films such as a first protective film 810a and a second protective film 810b that may protect a surface of the display module when the display module 10 is transferred may be attached thereto to cover an exposed surface thereof.

In this case, the protective film may not be attached to areas corresponding to the flexible circuit board 500 and the flexible circuit board fixing tape 510.

Figure 6D:
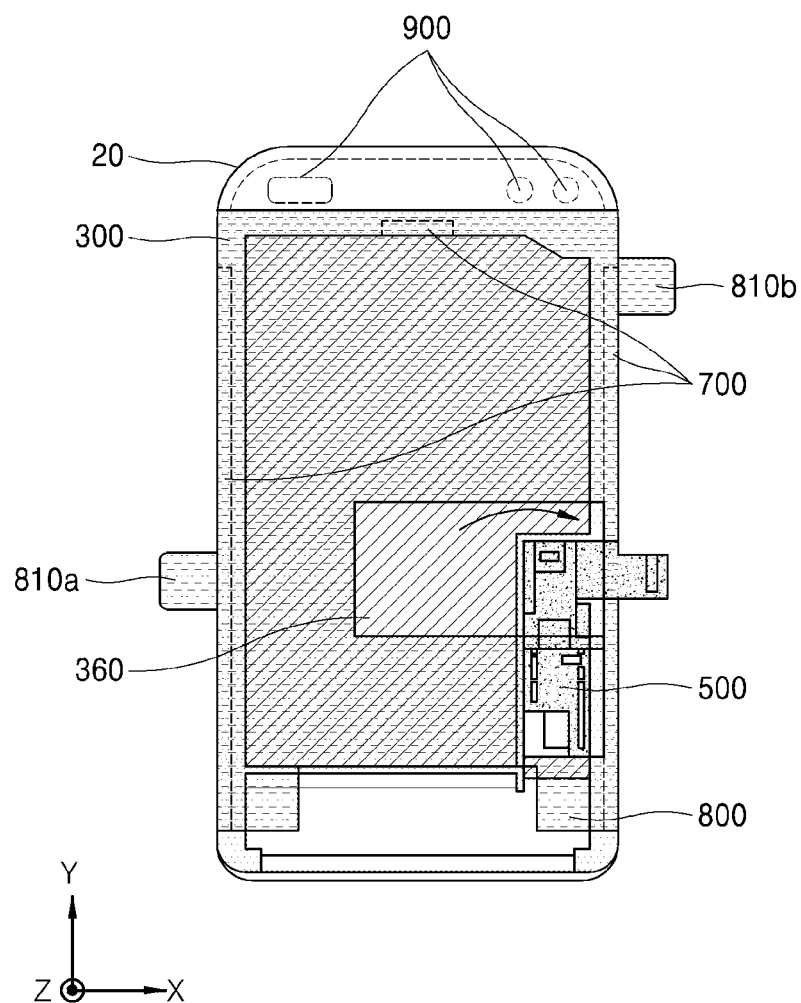

Next, as shown in FIG. 6D, the flexible circuit board fixing tape 510 is removed, and then, the flexible circuit board 500 is unbent to be restored to its original state.

In this way, when forming the charge discharge channel using the conductive solution 700, an additional process is utilized, such as bending and unbending the flexible circuit board 500 in order to apply the conductive solution 700. Thus, the process cost may increase due to poor process efficiency.

However, regarding the cushion plate 300 according to an embodiment of the present disclosure, the charge discharge channel may be formed by simply changing the shape of the cushion plate 300 without any additional process or component. Thus, the process cost may be reduced because the efficiency of the process is increased due to significant process reduction.

Further, as shown in FIG. 5, when the charge discharge channel is made of the conductive solution 700, the charge discharge channel directly contacts the side surface of the display panel 100, such that some of the charges introduced into the cover member 20 may flow into the display panel 100.

When some of the charges introduced into the cover member 20 flow into the display panel 100, the greenish defect may still occur even when the charge discharge channel is formed.

However, according to an embodiment of the present disclosure, the protrusion 325 of the cushion plate 300 is bent to have an inclined part so as not to contact the side surface of the display panel 100 and then contacts the cover member 20, the inflow of the electric charges into the display panel 100 may be reduced as much as possible in the process of discharging the electric charges through the charge discharge path.

Therefore, according to an embodiment of the present disclosure, greenish defect may be further suppressed when compared to Comparative Examples in which the charge discharge channel is formed.

Further, as in Comparative Example, when the conductive solution 700 is applied to form the charge discharge channel, additional material cost may be incurred. Further, when the solution is coated in an non-uniform manner, a defect in the charge discharge path may occur.

However, according to an embodiment of the present disclosure, the cushion plate 300 including the body 323 and the protrusion 325 includes the integrally-formed metal foam 320. Thus, there is no additional material cost. Further, it is possible to reduce a problem in which a thickness or a shape of the protrusion 325 is not uniform, such that the defect in the charge discharge path may be greatly reduced.

In addition, when the conductive solution 700 is applied as in Comparative Example, the conductive solution 700 in a form of a solution may flow into the through-hole 900 at a upper of the display module 10 and may interfere with the through-hole 900.

Accordingly, when applying the conductive solution 700 to the upper of the display module 10, care must be taken in the application process so that the conductive solution 700 does not flow into the through-hole 900.

However, according to an embodiment of the present disclosure, when forming the cushion plate 300, a pattern of the protrusion 325 is pre-designed into a shape that does not interfere with the through-hole 900, and then only the cushion plate 300 is attached to the display module. Thus, possibility of the interference thereof with the through-hole 900 may be very low, and a process may be greatly simplified.

Figure 8:
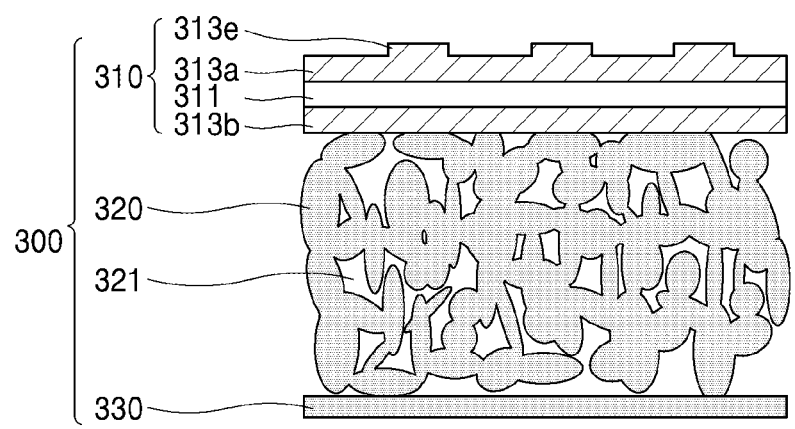

FIG. 8 shows a cushion plate 300 according to a second embodiment of the present disclosure.

In the cushion plate 300 according to the second embodiment, a metal foil 330 may be disposed on a lower surface of the metal foam 320 according to the first embodiment.

In this case, the metal foil 330 may include a metal mixture or an alloy including at least one selected from a group consisting of copper, nickel, iron, zinc, SUS, molybdenum, silver, platinum, gold, aluminum, chromium, indium, tin, magnesium, phosphorus, zinc, and manganese. However, the present disclosure is not limited thereto.

The metal foam 320 and the metal foil 330 may be made of the same metal material.

For example, the metal foam 320 may include a copper material, and the metal foil 330 may include a copper material.

When the metal foam 320 and the metal foil 330 are made of the same metal material, the cushion plate may have higher thermal conductivity, and the interlayer separation may be minimized due to high adhesion.

In one example, as described above, the metal foam 320 has a porous metal structure having a plurality of pores 321 inside the metal foam 320, and thus may have both a heat-dissipation function and a cushion function.

In particular, since the metal foam 320 has the porous structure having a large number of pores 321, the metal foam may have an excellent shock absorption function even though a separate cushion layer is not added.

However, when there are many pores 321 therein, the shock absorbing function may increase, while thermal conductivity and EMI shielding function may slightly decrease in inverse proportion to the increased shock absorbing function.

Therefore, in the second embodiment, when the metal foil 330 is additionally disposed on the lower surface of the metal foam 320, first heat conduction occurs along an entire surface of the metal foil 330 and then, second heat conduction occurs along the metal foam 320, such that more efficient and effective thermal conductivity may be obtained.

Further, adding the metal foil 330 to the lower surface of the metal foam 320, it may allow increasing an area of a metal layer while covering one surface of the porous metal foam 320 with the metal foil 330, further improving the EMI shielding performance.

Figure 9:
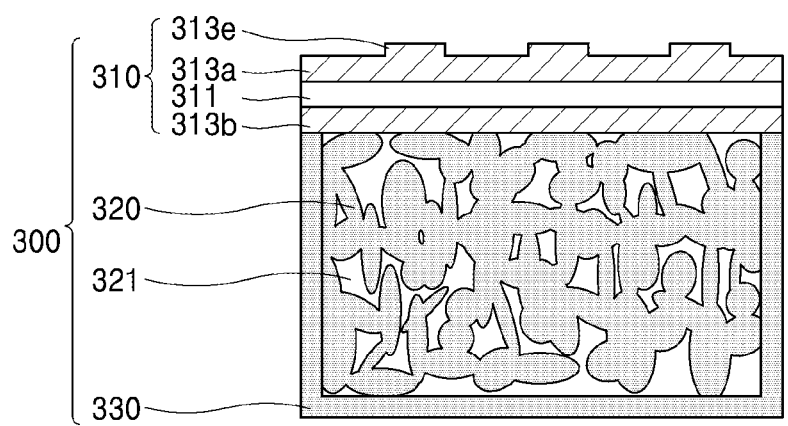

FIG. 9 shows a cushion plate 300 according to a third embodiment of the present disclosure.

In the cushion plate 300 according to the third embodiment, a metal foil 330 may be additionally disposed on a side surface of the metal foam 320 according to the second embodiment.

In other words, in the third embodiment, the metal foil 330 may cover an entirety of an outer surface of the metal foam 320 except for one surface thereof at which the metal foam 320 contacts the embossed layer 310.

As described above, the third embodiment has a structure in which the outer surface of the metal foam 320 is covered with the metal foil 330, a waterproof effect against external moisture may be secured and, further improved thermal conductivity and EMI shielding performance may be obtained.

Figure 10:
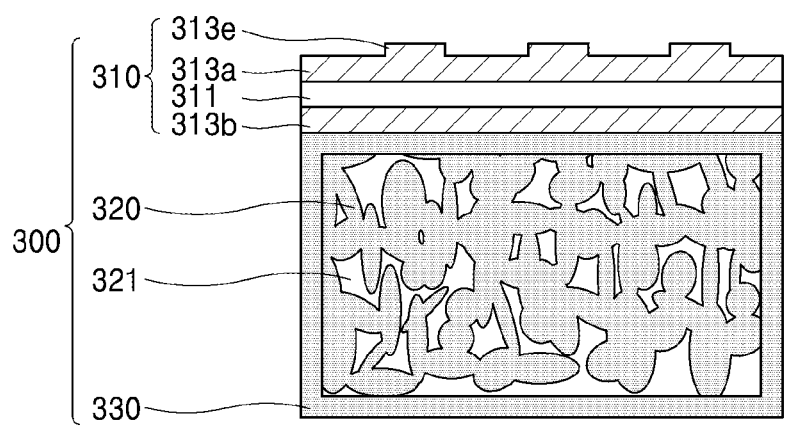

FIG. 10 shows a cushion plate 300 according to a fourth embodiment of the present disclosure.

In the cushion plate 300 according to the fourth embodiment, a metal foil 330 is additionally disposed on an entire outer surface of the metal foam 320 according to the third embodiment, so that the metal foam 320 may be sealed with the metal foil 330.

In other words, in the fourth embodiment, the metal foil 330 may cover an entirety of the outer surface of the metal foam 320.

Accordingly, the metal foil 330 may be added between the embossed layer 310 and the metal foam 320 to further increase the adhesion.

In addition, in the fourth embodiment, since the metal foam 320 is sealed with the metal foil 330, a waterproof effect against external moisture, and further improved thermal conductivity and EMI shielding performance may be secured.

Figure 11:
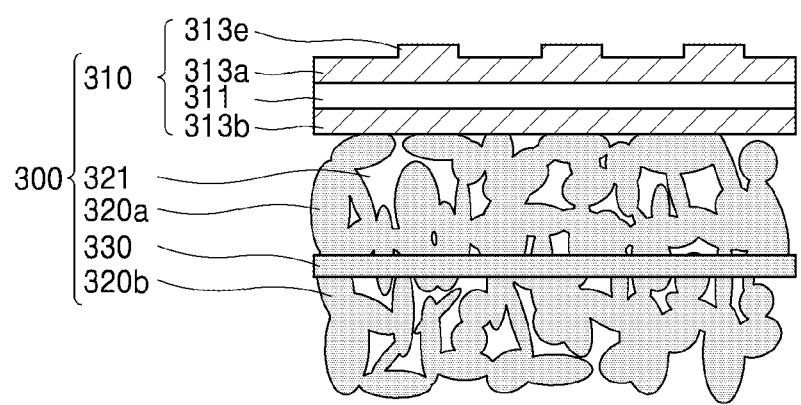

FIG. 11 shows a cushion plate 300 according to a fifth embodiment of the present disclosure.

In the cushion plate 300 according to the fifth embodiment, the metal foam 320 includes a first metal foam layer 320a, a second metal foam layer 320b, and a metal foil 330 disposed between the first metal foam layer 320a and the second metal foam layer 320b.

Specifically, the first metal foam layer 320a may be bonded to the embossed layer 310, and the second metal foam layer 320b may be bonded to the first metal foam layer 320a via the metal foil 330 interposed therebetween.

In the fifth embodiment, the metal foam 320 may be divided into a plurality of metal foam layers, and each metal foil 330 may be additionally disposed between adjacent layers of the plurality of metal foam layers, thereby further improving thermal conductivity and EMI shielding performance.

Figure 12:
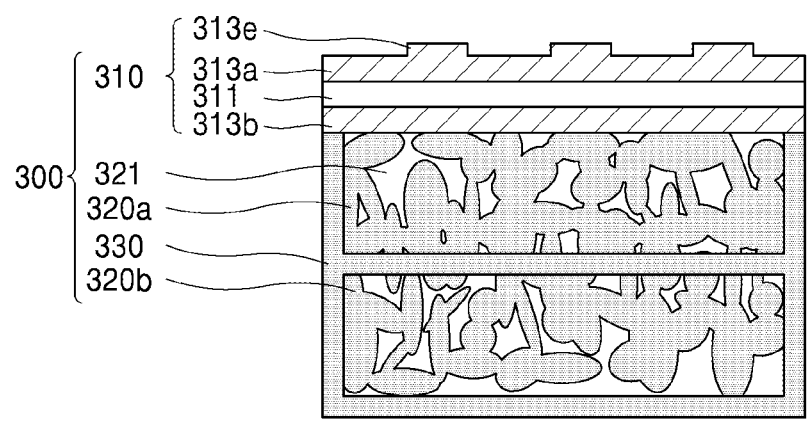

FIG. 12 shows a cushion plate 300 according to a sixth embodiment of the present disclosure.

In the cushion plate 300 according to the sixth embodiment, a metal foil 330 is additionally disposed on each of lower and side surfaces of the metal foam 320 according to the fifth embodiment, so that the second metal foam layer 320b may be sealed with the metal foil 330.

Specifically, the first metal foam layer 320a may be bonded to the embossed layer 310, and the second metal foam layer 320b may be bonded to the first metal foam layer 320a via the metal foil 330 interposed therebetween.

Further, covering the side surfaces of the first metal foam layer 320a and the second metal foam layer 320b and the lower surface of the second metal foam layer 320b with metal foil 330 may allow the second metal foam layer 320b to be sealed with the metal foil 330.

That is, in the sixth embodiment, the metal foam 320 may be divided into a plurality of metal foam layers, and each metal foil 330 may be additionally disposed between adjacent layers of the plurality of metal foam layers, and some of the metal foam layers may be sealed with the metal foil 330, thereby securing a waterproof effect against external moisture, and further improved thermal conductivity and EMI shielding performance.

Figure 13:
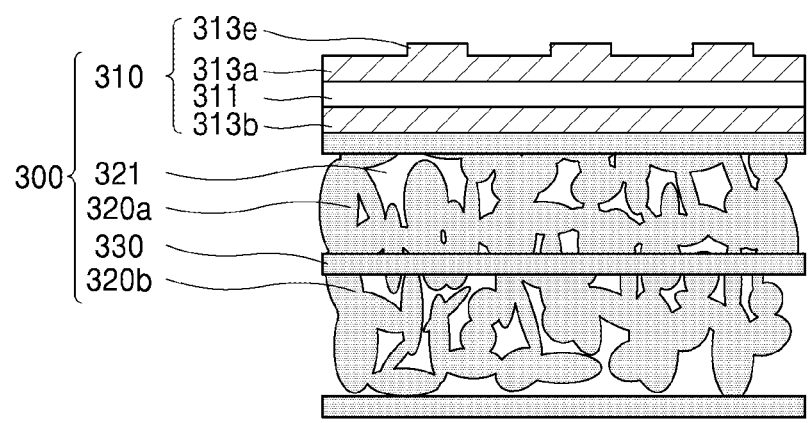

FIG. 13 shows a cushion plate 300 according to a seventh embodiment of the present disclosure.

In the cushion plate 300 according to the seventh embodiment, a metal foil 330 may be additionally disposed on the upper surface and the lower surface of the metal foam 320 according to the fifth embodiment.

Specifically, the first metal foam layer 320a may be bonded to the embossed layer 310 via a first metal foil 330 interposed therebetween, and the second metal foam layer 320*b* may be bonded to the first metal foam layer 320*a* via a second metal foil 330 interposed therebetween.

Further, an outer surface of the second metal foam layer 320*b* may be covered with the metal foil 330.

That is, in the seventh embodiment, the metal foam 320 may be divided into a plurality of metal foam layers, and each metal foil 330 may be additionally disposed between adjacent layers of the plurality of metal foam layers, and each of the metal foils 330 may be disposed to each of surfaces of the metal foam layers, thereby securing further improved thermal conductivity and EMI shielding performance.

Figure 14:
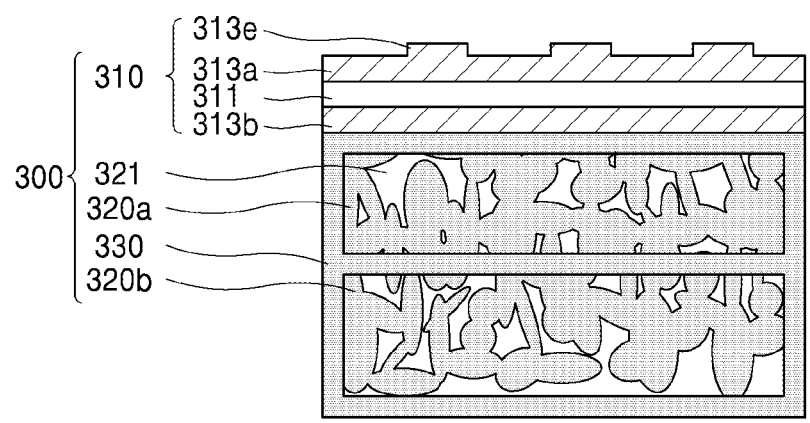

FIG. 14 shows a cushion plate 300 according to an eighth embodiment of the present disclosure.

In the cushion plate 300 according to the eighth embodiment, a metal foil 330 is additionally disposed on a side surface of the metal foam 320 according to the seventh embodiment, so that the first metal foam layer 320*a* and the second metal foam layer 320*b* may be sealed with the metal foil 330.

Specifically, the first metal foam layer 320*a* may be bonded to the embossed layer 310 via the first metal foil 330 interposed therebetween, and the second metal foam layer 320*b* may be bonded to the first metal foam layer 320*a* via the second metal foil 330 interposed therebetween.

Further, covering the upper surface of the first metal foam layer 320*a*, the side surfaces of the first metal foam layer 320*a* and the second metal foam layer 320*b*, and the lower surface of the second metal foam layer 320*b* with the metal foil 330, the first metal foam layer 320*a* and the second metal foam layer 320*b* may be sealed with the metal foil 330.

That is, in the eighth embodiment, the metal foam 320 may be divided into a plurality of metal foam layers, and each metal foil 330 may be additionally disposed between adjacent layers of the plurality of metal foam layers, and the metal foam layers may be sealed with the metal foil 330, thereby securing the waterproof effect against moisture, and further improved thermal conductivity and EMI shielding performance.

Figure 15:
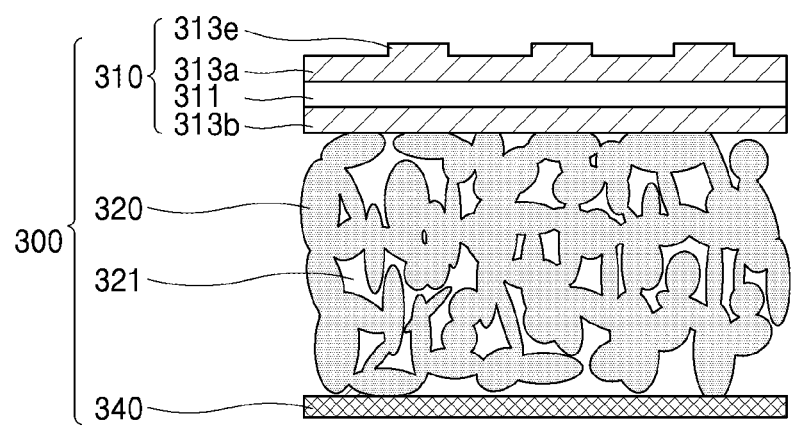

FIG. 15 shows a cushion plate 300 according to a ninth embodiment of the present disclosure.

In the cushion plate 300 according to the ninth embodiment, a metal paste 340 may be applied to a lower surface of the metal foam 320 according to the first embodiment.

In one example, the metal paste 340 may contain metal particles, solvent, binder, and surfactant.

In this case, the metal paste 340 may include metal particles made of a metal mixture or an alloy including at least one selected from a group consisting of copper, nickel, iron, zinc, SUS, molybdenum, silver, platinum, gold, aluminum, chromium, indium, tin, magnesium, phosphorus, zinc, and manganese. However, the present disclosure is not limited thereto.

Materials used for the solvent, the binder, and the surfactants are not particularly limited and may be those as commonly used in the art.

The metal paste 340 containing these materials may be applied to the lower surface of the metal foam 320 to form a metal paste layer on the lower surface of the metal foam 320.

Further, the metal paste 340 applied in this way may be additionally heat-treated to remove the solvent therefrom.

As described above, in the ninth embodiment, the metal paste 340 may be applied on the lower surface of the metal foam 320, such that further improved thermal conductivity and EMI shielding performance may be obtained.

Figure 16:
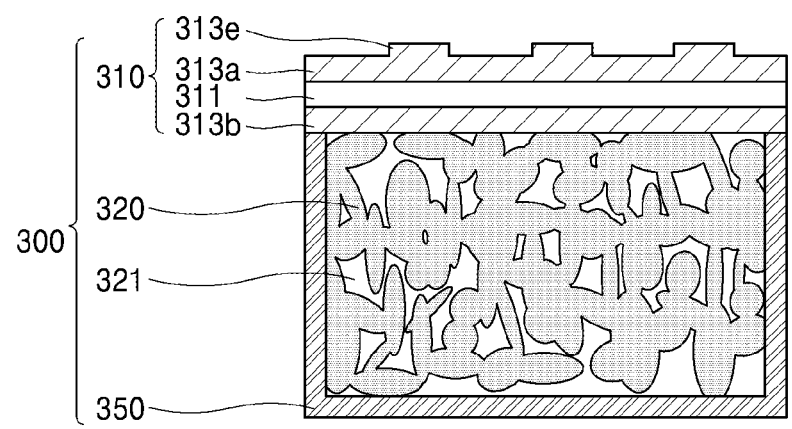

FIG. 16 shows a cushion plate 300 according to a tenth embodiment of the present disclosure.

In the cushion plate 300 according to the tenth embodiment, heat-dissipation ink (or heat-dissipation ink layer) 350 may be applied to the lower and side surfaces of the metal foam 320 according to the first embodiment.

The heat-dissipation ink 350 may contain a highly conductive material, for example, a carbon material or a metal filler.

In this case, the carbon material may include graphite, carbon nanofiber, or carbon nanotube. The metal filler may include metal powders having excellent thermal conductivity which may be made of a metal mixture or an alloy including at least one selected from a group consisting of copper, nickel, iron, zinc, SUS, molybdenum, silver, platinum, gold, aluminum, chromium, indium, tin, magnesium, phosphorus, zinc, and manganese. However, the present disclosure is not limited thereto.

However, the heat-dissipation ink 350 is not limited thereto. A material in the heat-dissipation ink 350 is not particularly limited and may be a material that may be typically used in this technical field.

Applying the heat-dissipation ink 350 on the lower and side surfaces of the metal foam 320 may allow the lower and side surfaces of the metal foam 320 to be covered with a heat-dissipation member in an easier manner.

As described above, in the tenth embodiment, further improved thermal conductivity and EMI shielding performance may be obtained by covering the lower surface and the side surface of the metal foam 320 with the heat-dissipation ink.

The bent panel fixing member 400 is placed under the cushion plate 300.

When bending the pad portion PAD of the display panel 100 from the bent portion BNP so that the pad portion PAD of the display panel 100 is placed under the lower surface of the front portion FP of the display panel 100, a restoring force to restore the display panel 100 to a state before the display panel 100 is bent may be applied to the display panel 100.

When the restoring force acts strongly, the pad portion PAD of the bent display panel 100 may not be fixedly maintained but may be lifted.

The bent panel fixing member 400 is disposed between the front portion FP of the display panel 100 and the pad portion PAD thereof to fix the bent display panel 100 such that the panel is maintained at the bent state.

The bent panel fixing member 400 is formed to have a certain thickness in a thickness direction of the bent portion. The bent panel fixing member 400 may be embodied as a double-sided tape with strong adhesive strength that may secure bonding between the front portion FP of the display panel 100 and the pad portion PAD thereof.

Further, the bent panel fixing member 400 may be embodied as a foam tape, or a foam pad, and may function as a shock absorber.

Further, the bent panel fixing member 400 may be embodied as a double-sided conductive tape having conductivity.

For example, the double-sided conductive tape may include a conductive layer between an upper adhesive layer and a lower adhesive layer, and the adhesive layer may include a conductive material.

In one example, a driving integrated circuit 160 may be disposed on an opposite surface of the pad portion PAD of the display panel 100 to one surface thereof on which the second backplate 220 is disposed.

In an embodiment according to the present disclosure, it is assumed that the driving integrated circuit 160 is embodied as COP (Chip On Plastic) mounted on the display substrate 110. However, the present disclosure is not limited thereto.

The driving integrated circuit 160 may be mounted on the display substrate 110 using a chip bonding process or a surface mounting process. In the bent state, the driving integrated circuit 160 may be disposed on a lower surface of the display substrate 110. That is, the driving integrated circuit 160 may be disposed on the lower surface of the pad portion PAD.

The driving integrated circuit 160 generates a data signal and a gate control signal based on image data and a timing synchronization signal supplied from an external host driving system. In addition, the driving integrated circuit 160 may supply the data signal to a data line of each pixel through the display pad, and may supply the gate control signal to a gate driving circuitry through the display pad.

That is, the driving integrated circuit 160 may be mounted on a chip mounting area defined on the display substrate 110 and may be electrically connected to the display pad, and may be connected to a signal line of each of the gate driving circuitry and the pixel array 120 disposed on the display substrate 110.

Since the driving integrated circuit 160 generates a considerable amount of heat, it is desirable to effectively impart a heat-dissipation effect to the driving integrated circuit 160.

Therefore, the driving integrated circuit 160 may be effectively heat-dissipated by the cushion plate 300 according to the embodiment of the present disclosure as described above.

The display pad may define a distal end of the display substrate 110 on which the driving integrated circuit 160 is mounted.

The display pad may be electrically connected to a flexible circuit board 500 on which a circuit board is mounted under the lower surface of the display substrate.

The flexible circuit board 500 may be electrically connected to the display pad defining the distal end of the display substrate 110 via a conductive adhesive layer 170 using a film attaching process, and may be disposed under the lower surface of the display panel 100.

In this case, the conductive adhesive layer 170 may be embodied as an ACF (Anisotropic Conductive Film) in one example.

The circuit board may provide the image data and the timing synchronization signal supplied from the host driving system to the driving integrated circuit 160, and may provide voltages for driving the pixel array 120, the gate driving circuitry, and the driving integrated circuit 160 thereto, respectively.

In one example, a bent portion reinforcing member 600 may be disposed on an outer surface 111 of the bent portion BNP of the display panel 100. The bent portion reinforcing member 600 may extend to cover the bent portion BNP, and cover at least a partial area of the front portion FP and at least a partial area of the pad portion PAD.

The bent portion reinforcing member 600 may include resin which may be embodied as an ultraviolet (UV) curable acrylic resin. However, the present disclosure is not limited thereto.

Specifically, the bent portion reinforcing member 600 may be made of a cured product of a resin resulting from a curing process after coating the resin. When the resin includes an ultraviolet curable resin, the curing may be performed using UV.

The bent portion reinforcing member 600 may be disposed on the outer surface 111 of the display panel 100 to cover various signal lines between the encapsulation portion 130 of the display panel 100 and the display pad. Accordingly, the bent portion reinforcing member 600 may prevent moisture invasion into the signal line while protecting the signal line from external impact.

Further, since the bent portion reinforcing member 600 is disposed on the outer surface 111 of the bent portion BNP, the rigidity of the bent portion BNP of the display panel 100 which is not provided with a backplate may be supplemented.

A display module according to one embodiment of the present disclosure includes a cover member; a display panel disposed on a lower surface of the cover member; and a cushion plate disposed on a lower surface of the display panel, wherein the cushion plate includes a metal foam.

In this case, the cushion plate includes a body and at least one protrusion protruding from and extending along at least one edge portion of the body, wherein the protrusion is in contact with the cover member.

The protrusion is in contact with an edge area of a lower surface of the cover member. The protrusion does not contact a side surface of the display panel.

Further, the protrusion is bent from the body toward a lower surface of the cover member. The protrusion has an inclined part.

A module fixing member is disposed between the cover member and the display panel, wherein both of the module fixing member and the protrusion contact a lower surface of the cover member, while the protrusion is spaced apart from the module fixing member by a predetermined distance.

The body and the protrusion are integral with each other.

The display panel includes a front portion, a bent portion, and a pad portion extending from the bent portion and disposed under a lower surface of the front portion, wherein the protrusion is absent on an edge portion of the cushion plate adjacent to the bent portion.

The cushion plate includes an embossed layer and the metal foam disposed on a lower surface of the embossed layer. The metal foam has a porous metal structure having a plurality of pores therein.

In one embodiment, a metal foil is disposed on a lower surface of the metal foam. A metal foil is additionally disposed on a side surface of the metal foam.

In another embodiment, the metal foam includes: a first metal foam layer; a second metal foam layer; and a metal foil disposed between the first metal foam layer and the second metal foam layer.

In another embodiment, metal paste is applied onto a lower surface of the metal foam.

In another embodiment, a heat-dissipation ink layer is applied onto lower and side surfaces of the metal foam.

A display device in accordance with one embodiment of the present disclosure includes a cover member; the display module in accordance with one embodiment of the present disclosure coupled to a lower surface of the cover member; and a frame disposed on a lower surface of the display module to support the cover member.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The invention claimed is:

1. A display module comprising:
a cover member;
a display panel disposed under the cover member; and
a cushion plate disposed under the display panel, the cushion plate including a metal foam,
wherein the cushion plate includes a body and at least one protrusion,
wherein the at least one protrusion of the cushion plate is in contact with the cover member,
wherein the display panel includes a front portion, a bent portion, and a pad portion extending from the bent portion of the display panel, the pad portion of the display panel being disposed under the front portion of the display panel, and
wherein the at least one protrusion of the cushion plate is absent from an edge portion of the cushion plate corresponding to the bent portion of the display panel.

2. The display module of claim 1, wherein the at least one protrusion of the cushion plate is in contact with an edge area of the cover member.

3. The display module of claim 1, wherein the at least one protrusion of the cushion plate extends from the body of the cushion plate toward the cover member.

4. The display module of claim 1, wherein the at least one protrusion of the cushion plate has an inclined part.

5. The display module of claim 1, wherein the at least one protrusion of the cushion plate does not contact a side surface of the display panel.

6. The display module of claim 1, wherein the cushion plate is connected to a ground.

7. The display module of claim 1, further comprising a first connection member disposed between the cover member and the display panel,
wherein the first connection member and the at least one protrusion of the cushion plate contact a lower surface of the cover member, and the at least one protrusion of the cushion plate is spaced apart from the first connection member.

8. The display module of claim 1, wherein the cushion plate further includes an embossed layer,
wherein the metal foam of the cushion plate is disposed under the embossed layer of the cushion plate.

9. The display module of claim 1, wherein the metal foam of the cushion plate has a porous metal structure having a plurality of pores.

10. The display module of claim 1, further comprising:
a metal foil disposed on a lower surface of the metal foam of the cushion plate.

11. The display module of claim 10, wherein the metal foil is additionally disposed on a side surface of the metal foam of the cushion plate.

12. The display module of claim 1, wherein the metal foam of the cushion plate includes:
a first metal foam layer;
a second metal foam layer; and
a metal foil disposed between the first metal foam layer and the second metal foam layer.

13. The display module of claim 1, further comprising:
a metal paste disposed on a lower surface of the metal foam.

14. The display module of claim 1, further comprising:
a heat-dissipation ink layer disposed on a lower surface and a side surfaces of the metal foam of the cushion plate.

15. A display device comprising:
a display module; and
a frame disposed under the display module, the frame being configured to support a cover member,
wherein the display module includes:
the cover member;
a display panel disposed under the cover member; and
a cushion plate disposed under the display panel, wherein the cushion plate includes a metal foam,
wherein the cushion plate includes a body and at least one protrusion,
wherein the at least one protrusion of the cushion plate is in contact with the cover member, and
wherein the display panel includes a front portion, a bent portion, and a pad portion extending from the bent portion of the display panel, the pad portion of the display panel being disposed under the front portion of the display panel,
wherein the at least one protrusion of the cushion plate is absent from an edge portion of the cushion plate corresponding to the bent portion of the display panel.

16. The display module of claim 15, wherein the at least one protrusion of the cushion plate is in contact with an edge area of the cover member.

17. The display module of claim 15, wherein the at least one protrusion of the cushion plate extends from the body of the cushion plate toward the cover member.

18. The display module of claim 15, wherein the at least one protrusion of the cushion plate has an inclined part.

19. The display module of claim 15, wherein the cushion plate is connected to a ground.

* * * * *